US012787460B2

(12) United States Patent
Koren et al.

(10) Patent No.: US 12,787,460 B2
(45) Date of Patent: Nov. 3, 2026

(54) HETEROSTRUCTURE HAVING NON-VOLATILE ACTUATABLE POLARIZATION

(71) Applicant: Technion Research & Development Foundation Limited, Haifa (IL)

(72) Inventors: Elad Koren, Haifa (IL); Debopriya Dutta, Haifa (IL); Subhrajit Mukherjee, Haifa (IL)

(73) Assignee: Technion Research & Development Foundation Limited, Haifa (IL)

( * ) Notice: Subject to any disclaimer, the term of this patent is extended or adjusted under 35 U.S.C. 154(b) by 402 days.

(21) Appl. No.: 18/506,163

(22) Filed: Nov. 10, 2023

(65) Prior Publication Data

US 2024/0162367 A1 May 16, 2024

(30) Foreign Application Priority Data

Nov. 10, 2022 (IN) ............................ 202221064273

(51) Int. Cl.

| | |
|---|---|
| ***H10F 30/282*** | (2025.01) |
| ***H10F 30/222*** | (2025.01) |
| ***H10F 30/28*** | (2025.01) |
| ***H10F 71/00*** | (2025.01) |
| ***H10F 77/12*** | (2025.01) |
| ***H10F 77/16*** | (2025.01) |

(52) U.S. Cl.

CPC ........... *H10F 30/282* (2025.01); *H10F 71/00* (2025.01); *H10F 77/12* (2025.01)

(58) Field of Classification Search

CPC ........ H10F 30/282; H10F 71/00; H10F 77/12; H10F 30/222; H10F 30/28; H10F 77/16

See application file for complete search history.

(56) References Cited

U.S. PATENT DOCUMENTS

2015/0333196 A1* 11/2015 Shin ........................ H10F 30/00 257/29
2019/0378946 A1* 12/2019 Jo ........................... H10F 10/10
2020/0203381 A1* 6/2020 Rabkin .................. H10B 51/20
2021/0151446 A1* 5/2021 Lee ...................... H10N 70/826

OTHER PUBLICATIONS

Chai et al. "Nonvolatile Ferroelectric Field-Effect Transistors", Nature Communications, 11(1): 2811-1-2811-9, Jun. 4, 2020.
Chang et al. "Discovery of Robust In-Plane Ferroelectricity in Atomic-Thick SnTe", Science, 353(6296): 274-278, Jul. 15, 2016.
Dutta et al. "Cross-Field Optoelectronic Modulation Via Inter-Coupled Ferroelectricity in 2D In2Se3", NPJ 2D Materials and Applications, 5(81): 81-1- 81-8, Sep. 24, 2021.

(Continued)

*Primary Examiner* — Herve-Louis Y Assouman

(57) ABSTRACT

A heterostructure system comprises a two-dimensional ferroelectric material on a dielectric substrate, and a two-dimensional semiconductor material having a first region disposed on the ferroelectric material and a second region disposed on the dielectric substrate, wherein an edge of the ferroelectric material is between the first region and the second region of the semiconductor material.

17 Claims, 13 Drawing Sheets
(12 of 13 Drawing Sheet(s) Filed in Color)

(56) References Cited

OTHER PUBLICATIONS

Gao et al. "Intrinsic Polarization Coupling in 2D Alpha-In2Se3 Toward Artificial Synapse With Multimode Operations", SmartMat, 2(1): 88-98, Dec. 30, 2020.
Guo et al. "Non-Volatile Memory Based on the Ferroelectric Photovoltaic Effect", Nature Communications, 4: 1990-1-1990-5, Jun. 11, 2013.
Hwang et al. "Ferroelectric Materials for Neuromorphic Computing", APL Materials, 7(9): 091109-1-091109-14, Sep. 19, 2019.
Kim et al. "High-Mobility and Low-Power Thin-Film Transistors Based on Multilayer MoS2 Crystals", Nature Communications, 3(1): 1011-1-1011-7, Aug. 21, 2012.
Wang et al. "Exploring Ferroelectric Switching in Alpha-In2Se3 for Neuromorphic Computing", Advanced Functional Materials, 30(45): 2004609-1-2004609-9, Sep. 9, 2020.
Wu et al. "Vertical MoS2 Transistors With Sub-1-Nm Gate Lengths", Nature, 603(7900): 259-264, Mar. 9, 2022.
Xue et al. "Room-Temperature Ferroelectricity in Hexagonally Layered Alpha-In2Se3 Nanoflakes Down to the Monolayer Limit", Advanced Functional Materials, 28(50): 1803738-1-1803738-7, Oct. 21, 2018.

* cited by examiner

FIG. 4C
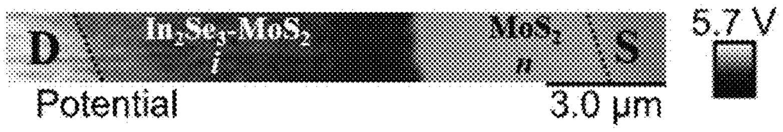
FIG. 4D
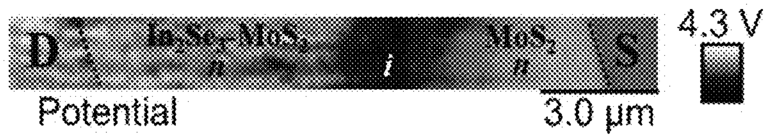
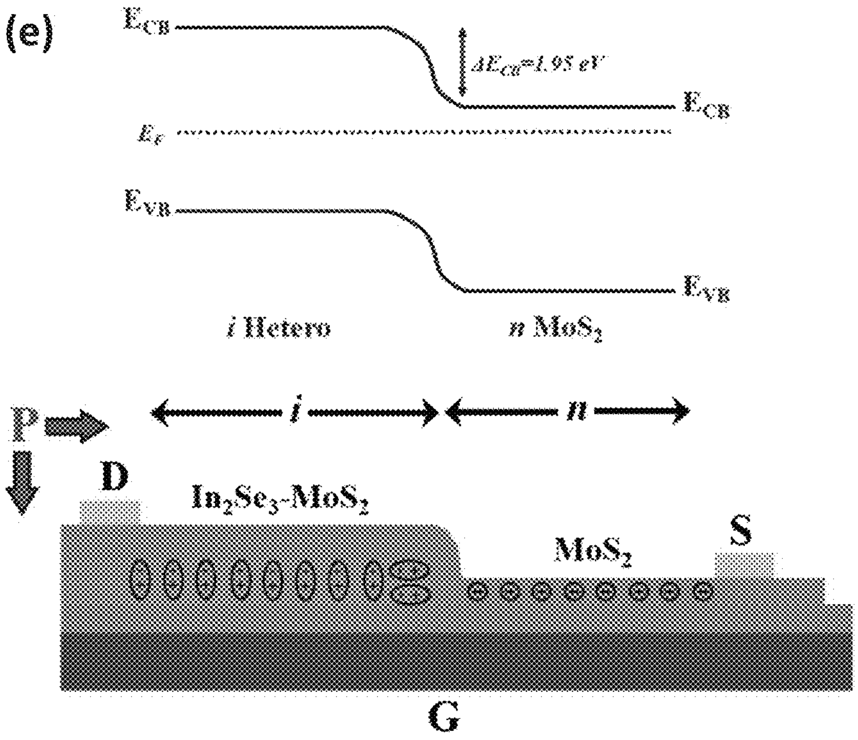
FIG. 4E

HETEROSTRUCTURE HAVING NON-VOLATILE ACTUATABLE POLARIZATION

RELATED APPLICATION

This application claims the benefit of priority of Indian Patent Application No. 202221064273 filed on Nov. 10, 2022, the contents of which are incorporated herein by reference in their entirety.

FIELD AND BACKGROUND OF THE INVENTION

The present invention, in some embodiments thereof, relates to heterostructures and, more particularly, but not exclusively, to a heterostructure having non-volatile actuatable polarization.

The field of materials science has undergone a transformative revolution in the past few decades, driven by the quest for innovative materials with extraordinary properties and functionalities. Among the numerous avenues explored, heterostructures have emerged as a promising and fascinating realm, offering a rich landscape of unprecedented opportunities for technological advancements and scientific discovery. Heterostructures are composite materials composed of distinct crystalline layers, each with its unique properties and functionalities, intricately stacked and engineered to create new materials with tailored characteristics.

The versatility of heterostructures has spurred significant interest in various technological applications. These include high-performance transistors, photodetectors, light-emitting diodes, and quantum devices. Heterostructures have also found application in energy harvesting, catalysis, and sensing, offering solutions to address pressing global challenges in fields such as renewable energy and environmental protection.

SUMMARY OF THE INVENTION

According to an aspect of some embodiments of the present invention there is provided a heterostructure system, comprising: a dielectric substrate, a two-dimensional ferroelectric material on the dielectric substrate, and a two-dimensional semiconductor material having a first region disposed on the ferroelectric material and a second region disposed on the dielectric substrate, wherein an edge of the ferroelectric material is between the first region and the second region of the semiconductor material. In some embodiments of the present invention the system comprises a polarization actuation mechanism for actuating non-volatile polarization at the edge.

According to an aspect of some embodiments of the present invention there is provided a method of fabricating a heterostructure system. The method comprises applying a two-dimensional ferroelectric material onto a dielectric substrate, applying a two-dimensional semiconductor material over the dielectric substrate and the ferroelectric material in a manner that a first region of the semiconductor material is disposed on the ferroelectric material and a second region of the semiconductor material is disposed on the dielectric substrate, wherein an edge of the ferroelectric material is between the first region and the second region of the semiconductor material. In some embodiments of the present invention the method also comprises forming a polarization actuation mechanism contacting at least one of the semiconductor material and the dielectric substrate to allow electrical actuation of non-volatile polarization at the edge. Alternatively or additionally, a light source can be positioned to illuminate at least the edge by light to allow optical actuation of non-volatile polarization at the edge.

The polarization of the system can therefore be actuated optically and/or electrically. When optical actuation is employed a light source illuminates the system by a light beam, which can be a pulsed light beam or a continuous wave light beam. When electrical actuation is employed the polarization of the system is actuated by either gate electrode or by applying a potential between a source and a drain electrode. The gate electrode can be a back-gate electrode or a top-gate electrode. Thus, according to some embodiments of the invention the polarization actuation mechanism comprises a light source configured to illuminate at least the edge of the ferroelectric material, according to some embodiments of the invention the polarization actuation mechanism comprises a gate electrode, and according to some embodiments of the invention the polarization actuation mechanism comprises a source electrode and a drain electrode connected to the semiconductor material.

According to some embodiments of the invention the semiconductor material comprises a transition metal chalcogenide.

According to some embodiments of the invention the transition metal dichalcogenide is selected from the group consisting of $MoS_2$, $WSe_2$, $WS_2$, $MoSe_2$, $TiS_2$, $TiSe_2$, $TiTe_2$, $VS_2$, $VSe_2$, $VTe_2$, $CrS_2$, $CoTe_2$, $NiTe_2$, $ZrS_2$, $ZrSe_2$, $YSe_2$, $NbS_2$, $NbSe_2$, $NbTe_2$, $TcS_2$, $TcSe_2$, $TcTe_2$, $PdS_2$, $PdSe_2$, $PdTe_2$, $LaSe_2$, $HfS_2$, $HfSe_2$, $HfTe_2$, $TaS_2$, $TaSe_2$, $TaTe_2$, $WS_2$, $WSe_2$, $WTe_2$, $ReS_2$, $ReSe_2$, $IrTe_2$, $PtS_2$, $PtSe_2$, $PtTe_2$ and $AuTe_2$.

According to some embodiments of the invention the ferroelectric material is selected from the group consisting of $In_2Se_3$, $CuInP_2S_6$, $CuInP_2Se_6$, $CuCrP_2S_6$, and $CuCrP_2Se_6$.

According to some embodiments of the invention the ferroelectric material and the semiconductor material are attached to each other by van der Waals forces.

According to some embodiments of the invention the edge has a sub-nanometer thickness.

According to some embodiments of the invention the system comprises a polarization screening layer between the ferroelectric material and the semiconductor material.

According to some embodiments of the invention the polarization screening layer comprises conductive materials such as graphene or metallic such as aluminum.

According to some embodiments of the invention the polarization screening layer is between the ferroelectric material and the semiconducting material. In some embodiments, which are not to be considered as limiting, the polarization screening layer is between the ferroelectric material and the semiconductor material but not between the semiconductor material and the dielectric substrate.

According to some embodiments of the invention the polarization actuation mechanism is configured to invert an in-plane or/and an out-of-plane polarization of the ferroelectric material and modulate the charge concentration at the semiconductor material next to the edge of the ferroelectric material.

According to some embodiments of the invention the materials are selected such that when the polarization is at one state, the first region has doped (e.g., conductive) properties and when the polarization is at an opposite state, the first region has intrinsic (e.g., insulating) properties.

According to some embodiments of the invention the materials are selected such that when the polarization is at one state, the first region has conductive properties of a first polarity, and when the polarization is at an opposite state, the first region has conductive properties of a second polarity, the second polarity being opposite to the first polarity.

According to some embodiments of the invention the system is a component in a field effect transistor.

According to some embodiments of the invention the system is a component in a transducer. According to some embodiments of the invention the transducer is an optical transducer.

According to some embodiments of the invention the system is a component in a sensor. According to some embodiments of the invention the sensor is a photo-sensor.

According to some embodiments of the invention the system is a component in a non-volatile memory.

According to some embodiments of the invention the system is a component in a neuromorphic device.

According to some embodiments of the invention the system is a component in an in-memory computing device.

According to some embodiments of the invention the system is a component in an energy harvesting device.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

The patent or application file contains at least one drawing executed in color. Copies of this patent or patent application publication with color drawings will be provided by the Office upon request and payment of the necessary fee.

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

Figure 1A:
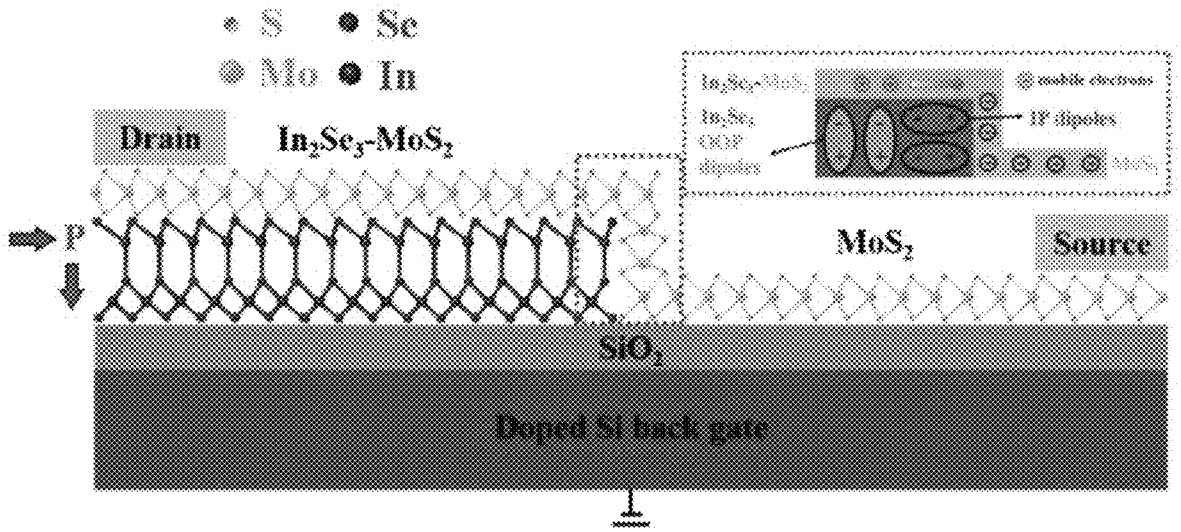
Figure 1B:
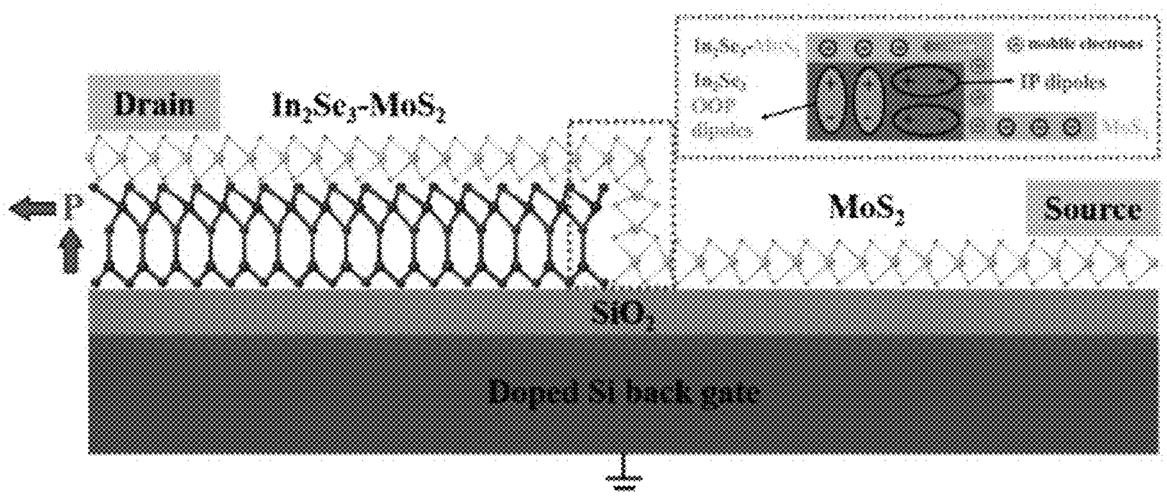
Figure 1C:
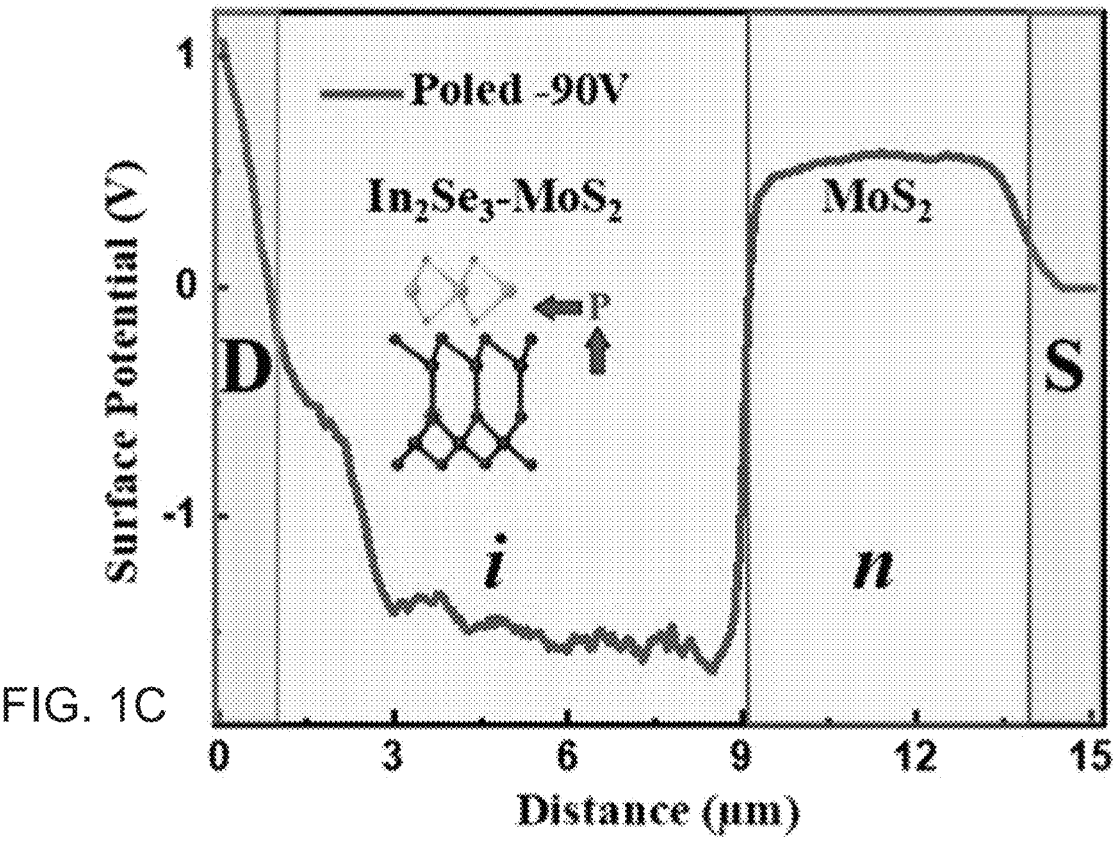
Figure 1D:
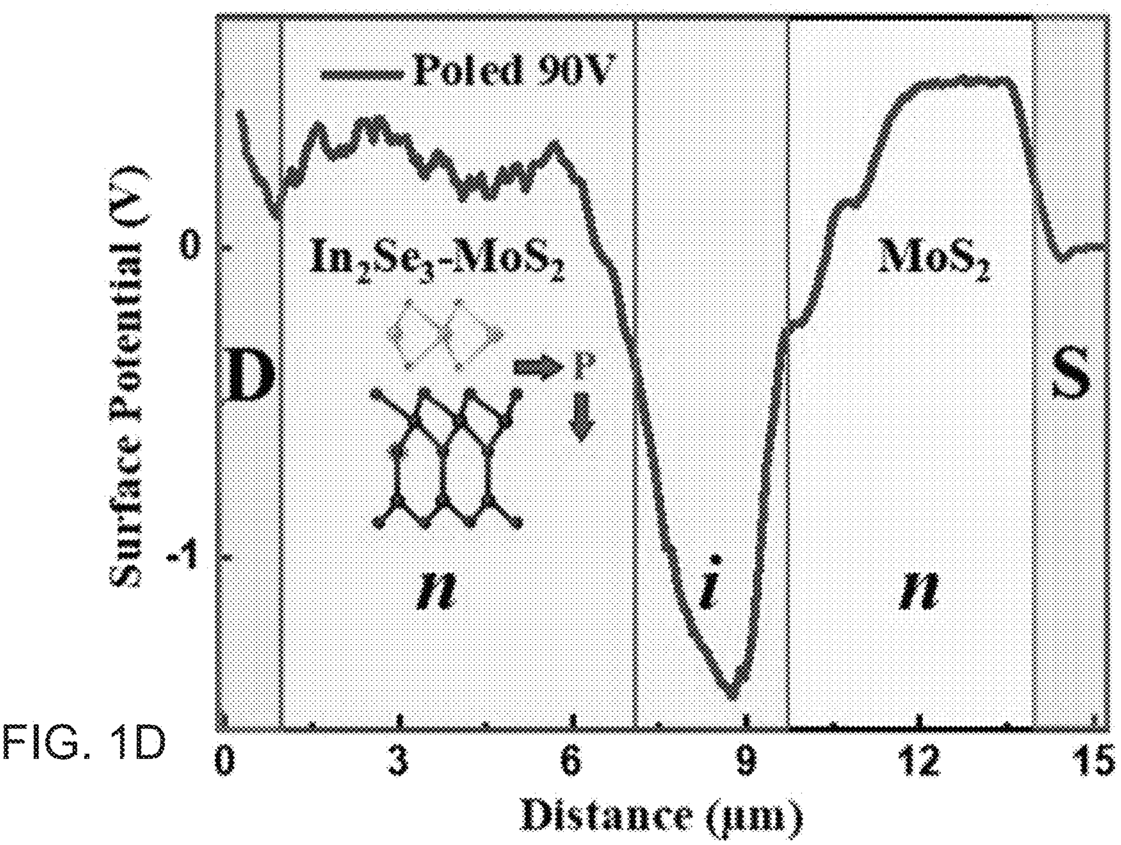
Figure 1E:
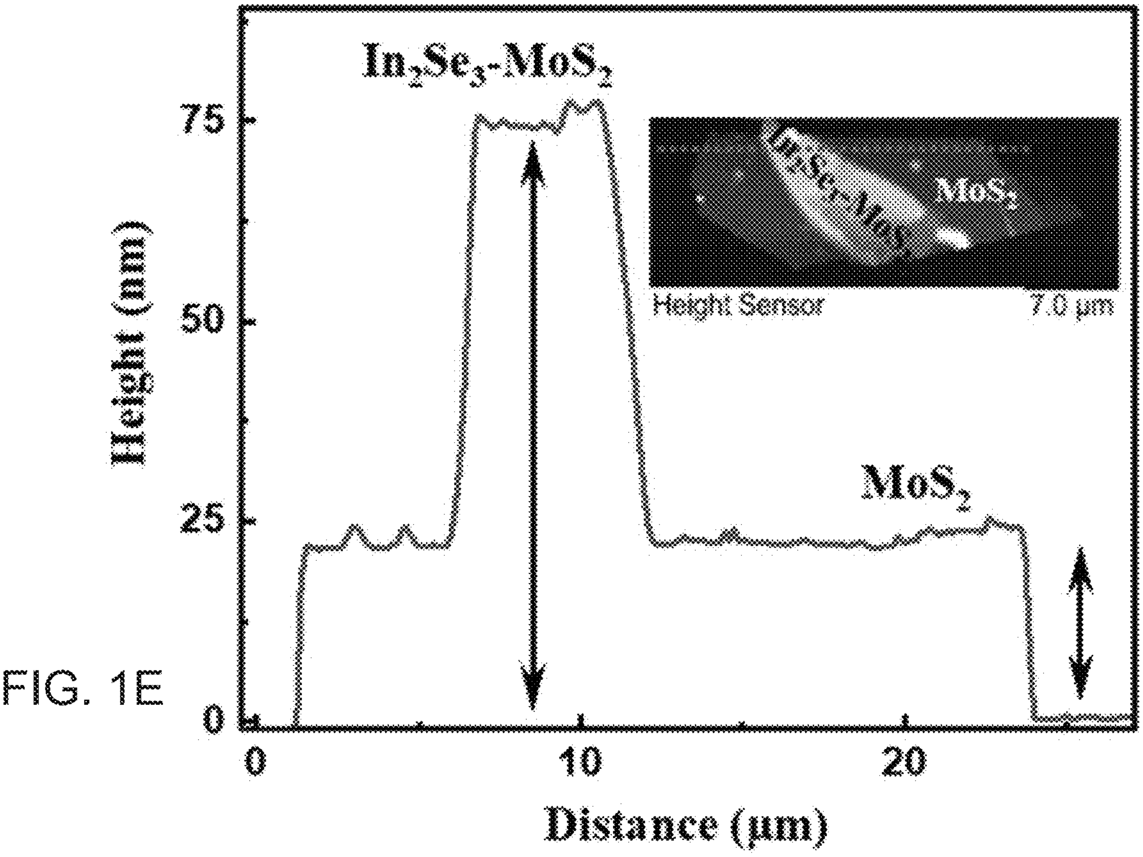
Figure 1F:
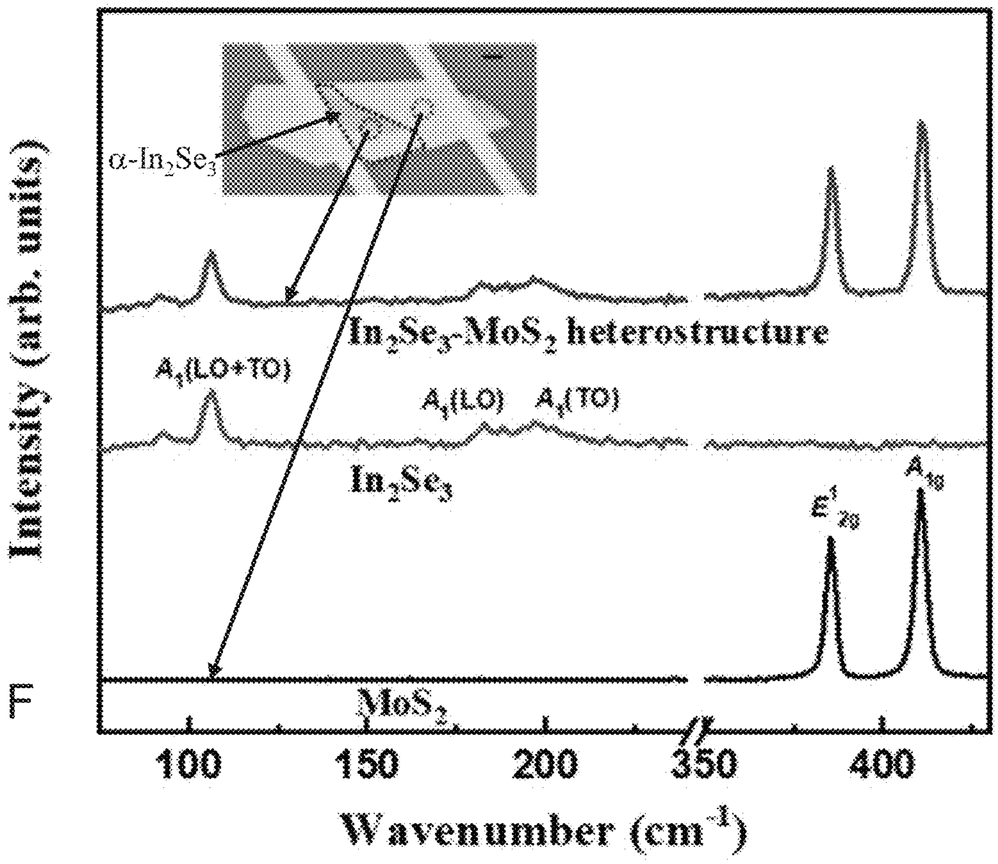

FIGS. 1A-F show schematic illustration of a heterostructure system and characterization thereof as obtained in experiments performed according to some embodiments of the present invention. FIGS. 1A-B show schematic illustrations of a heterostructure with $MoS_2$ transferred onto $In_2Se_3$ with corresponding atomic arrangement for negative (FIG. 1A) and positive (FIG. 1B) poling. The dotted box shows the zoomed in charge concentration modulation and migration of electrons in $MoS_2$ as a result of out-of-plane (OOP) dipole orientation (vertical ovals) and in-plane (IP) dipole orientation (horizontal ovals) in $In_2Se_3$. The OOP dipoles creates local 'i' and 'n' regions in overlying $MoS_2$, depending on the polarization direction P indicated by the block arrows at the left-hand-side of the illustration. FIGS. 1C-D show Kelvin probe profiles showing local 'p' and 'n' regions as a function of negative (FIG. 1C) and positive (FIG. 1D) poling. FIG. 1E shows height profile of the heterostructure system. The inset in FIG. 1E shows AFM topography of the heterostructure system where the dotted line marks the presented cross-section topography profile. FIG. 1F shows Raman spectra of $MoS_2$ flake, heterostructure, and $\alpha$-$In_2Se_3$. The inset in FIG. 1F shows an optical image of the heterostructure system and the arrows mark the regions at which the Raman spectra of the $MoS_2$ flake and of the heterostructure were measured. The Raman spectra of $\alpha$-$In_2Se_3$ was measured before the $MoS_2$ transfer. The underlying $\alpha$-$In_2Se_3$ is marked by the dotted region in the inset.

Figure 2A:
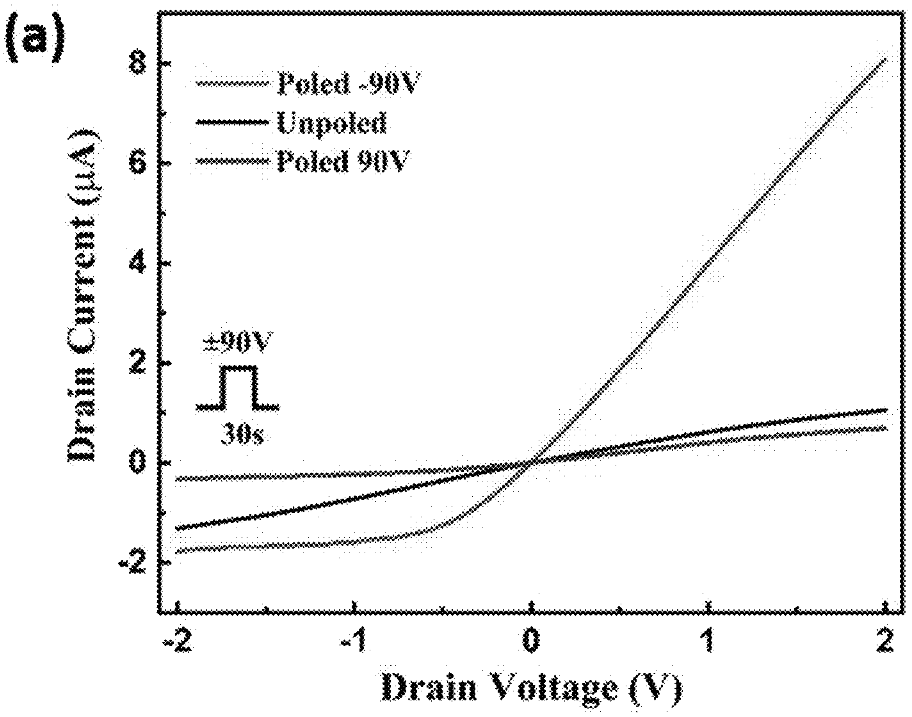
Figure 2B:
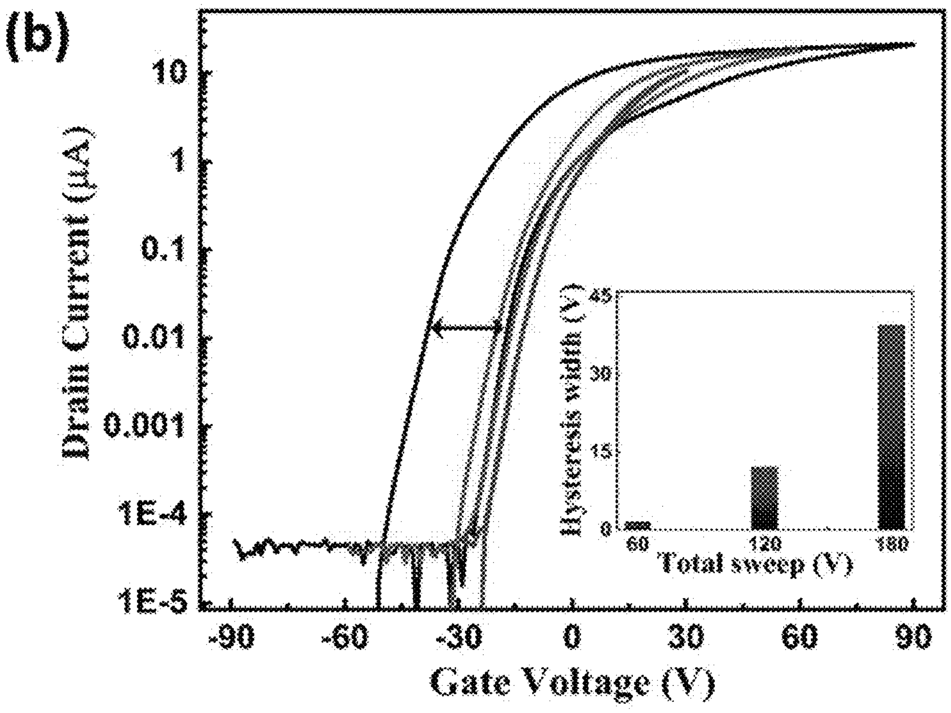
Figure 2C:
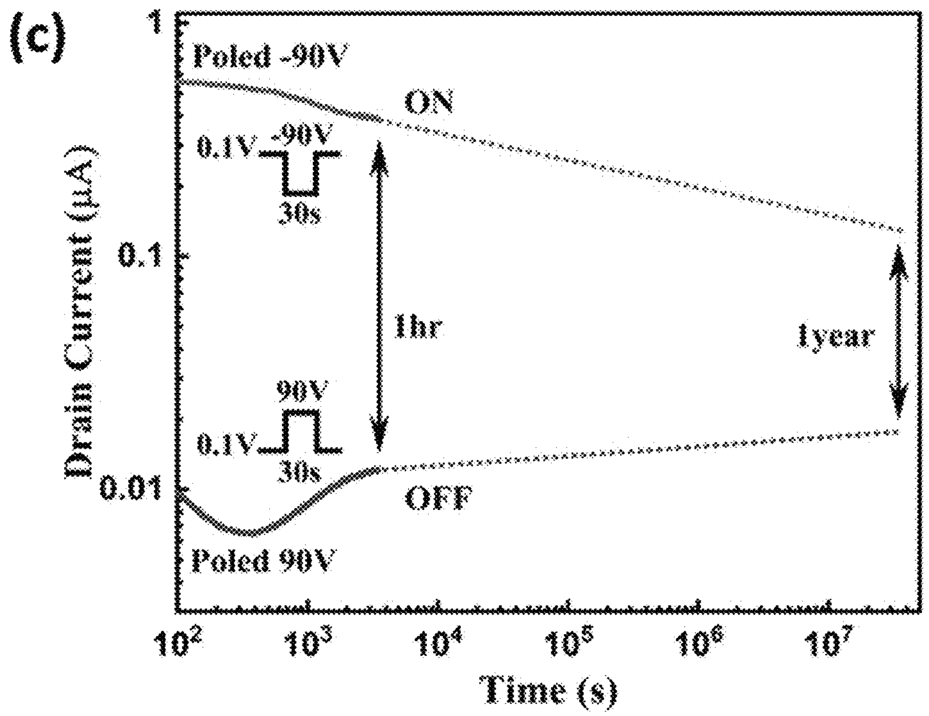
Figure 2D:
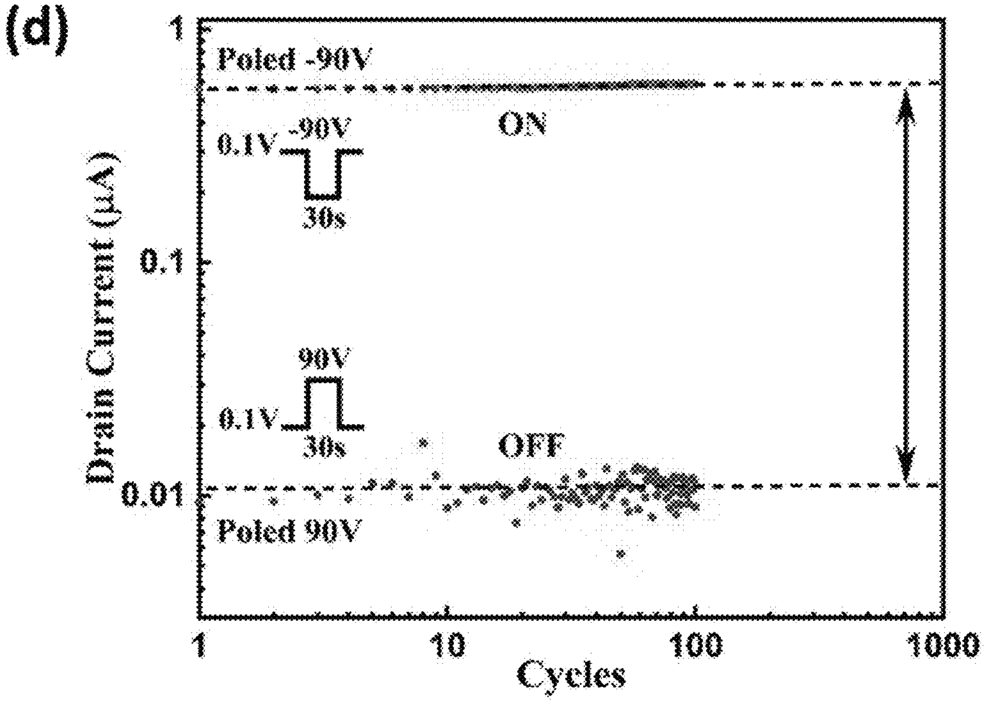

FIGS. 2A-D show electrical characterization of the heterostructure system, as obtained in experiments performed according to some embodiments of the present invention. FIG. 2A shows ID-VD following different gate poling conditions, FIG. 2B shows ID-VG for different gate range sweeps, where the inset shows the increasing hysteresis in the device with greater sweep voltage, FIG. 2C shows retention test of the "OFF" and "ON" states after respective poling conditions showing expected retention for more than 1 year, and FIG. 2D shows results of an endurance test of the FeFET showing consistent current levels after poling for both "ON" and "OFF" states for at least 100 cycles.

Figure 3A:
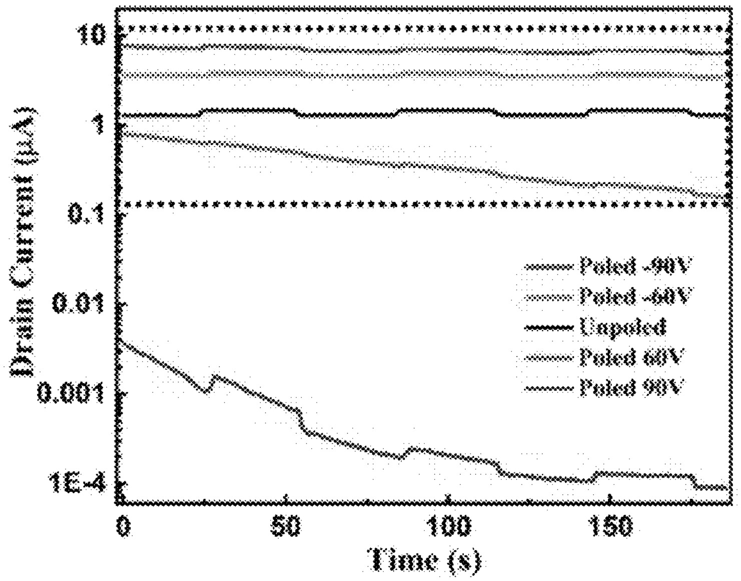
Figure 3B:
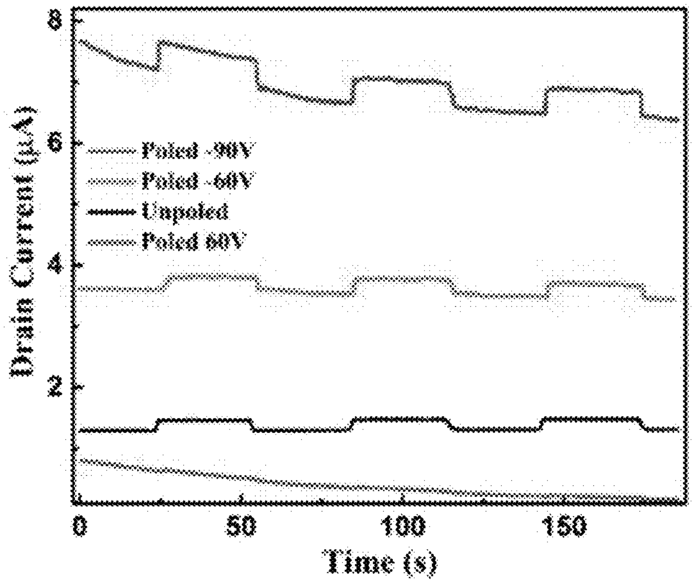
Figure 3C:
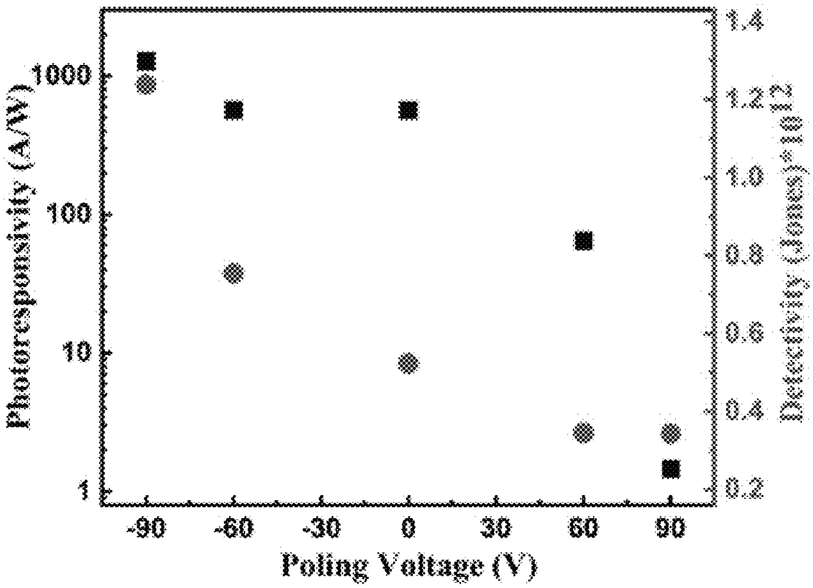

FIGS. 3A-C show results of experiments performed according to some embodiments of the present invention to investigate a poling dependent photoresponse. FIG. 3A shows drain current following poling with different gate voltages, FIG. 3B shows drain current for selected poling voltages marked by the dotted rectangle in FIG. 3A, and FIG. 3C shows calculated photoresponsivity (squares, left ordinate) and detectivity (circles, right ordinate) for different poling conditions.

Figure 4A:
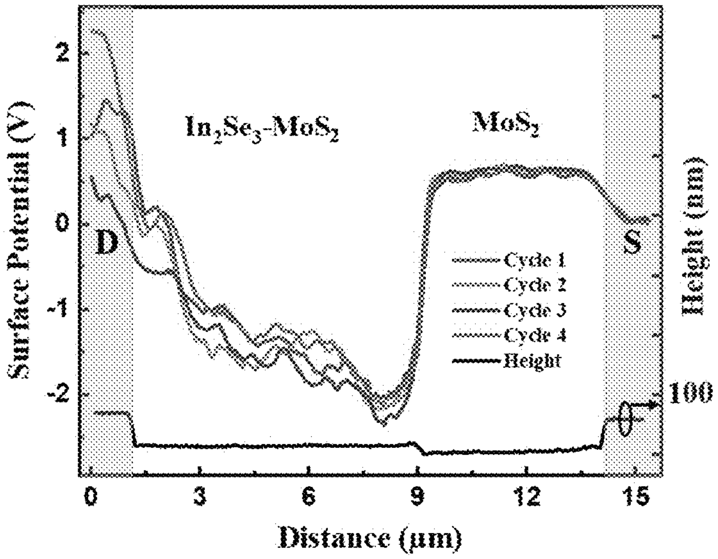
Figure 4B:
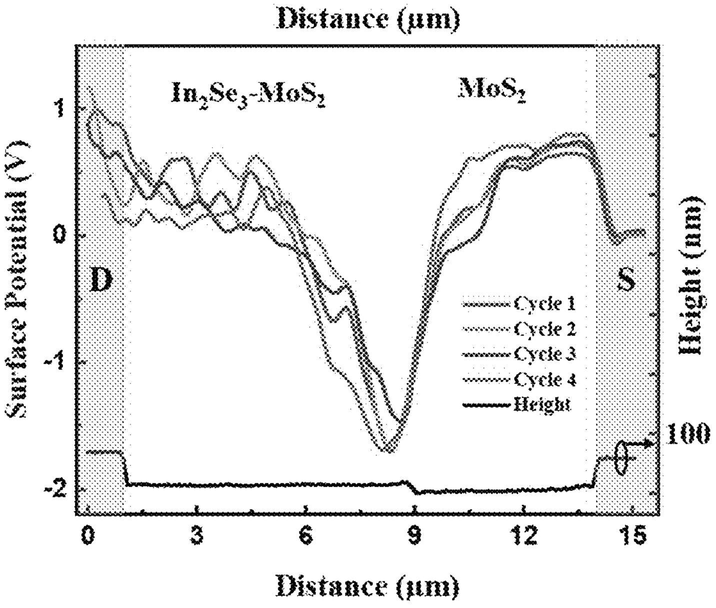
Figure 4F:
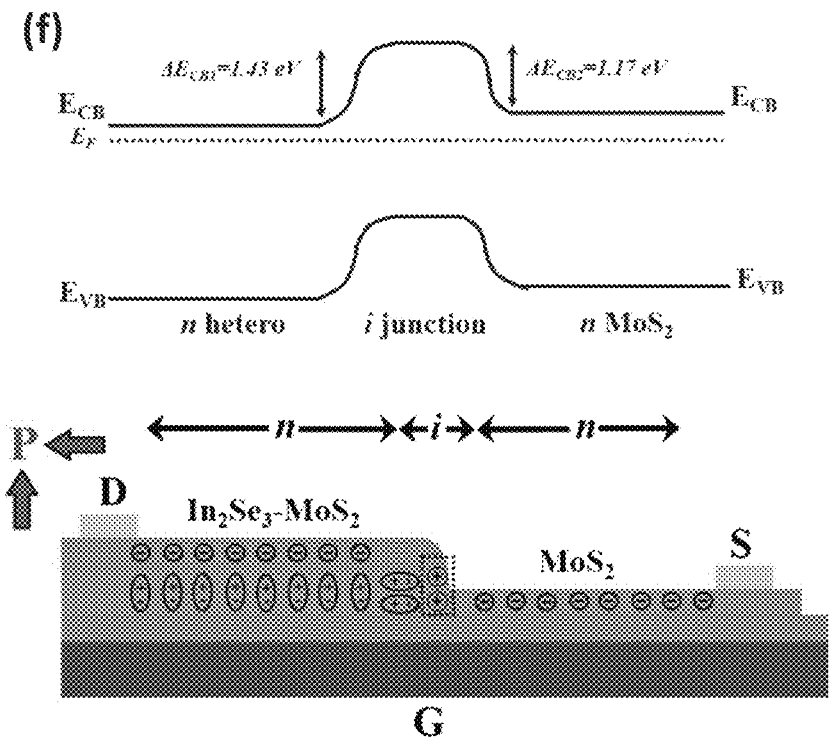

FIGS. 4A-F show results of experiments performed according to some embodiments of the present invention to investigate surface potential and mechanism of conduction modulation in a FeFET due to polarization in $\alpha$-$In_2Se_3$. FIGS. 4A-B show potential profiles across the FET channel measured 2 mins following multiple withdrawals of applied gate voltages of −90 V (FIG. 4A) and +90 V (FIG. 4B). The right ordinate shows the height profile. FIGS. 4C-D show surface potential maps of the FeFET following withdrawal of −90 V (FIG. 4C) and +90 V (FIG. 4D) applied gate voltages showing distinct n and i regions. FIGS. 4E-F are schematic illustrations showing the induced dipole polarization within the $In_2Se_3$ and the corresponding formation of the n, i regions in the $MoS_2$ channel according to the extracted band diagrams based on the surface potential mapping following negative (FIG. 4E) and positive (FIG. 4F) back gate potentials.

Figure 5A:
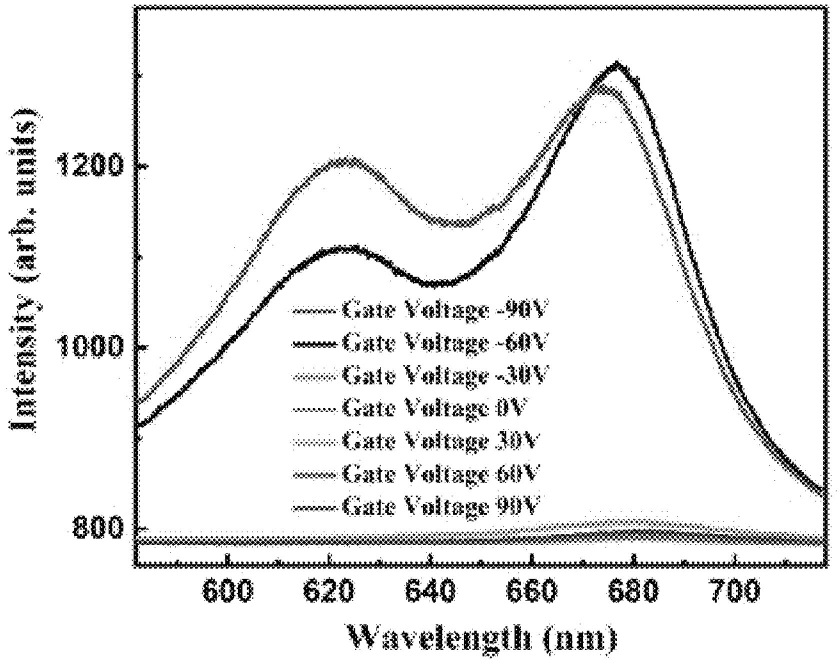
Figure 5B:
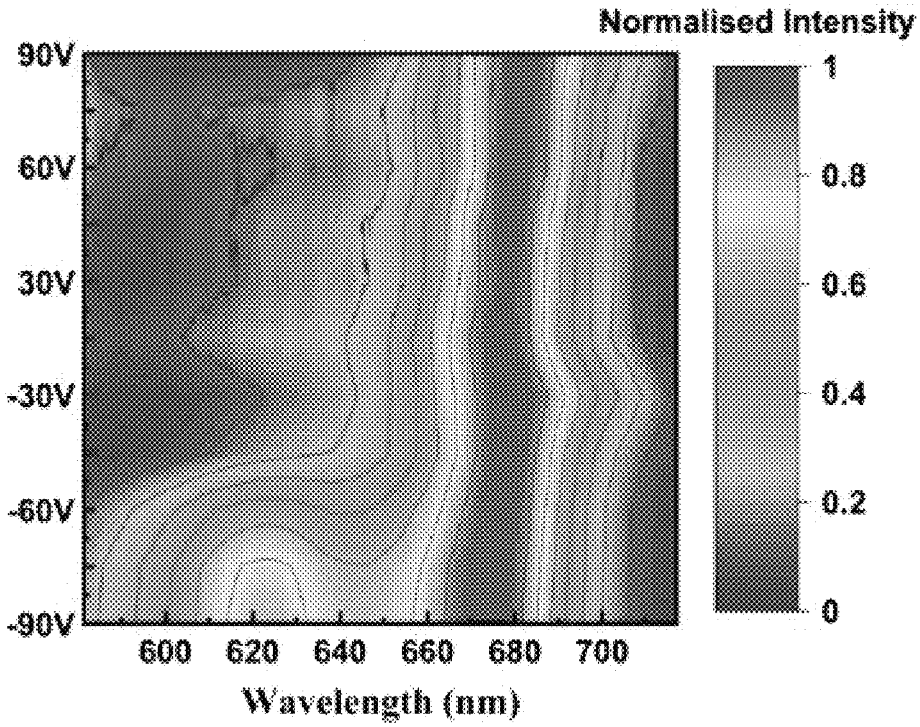
Figure 5C:
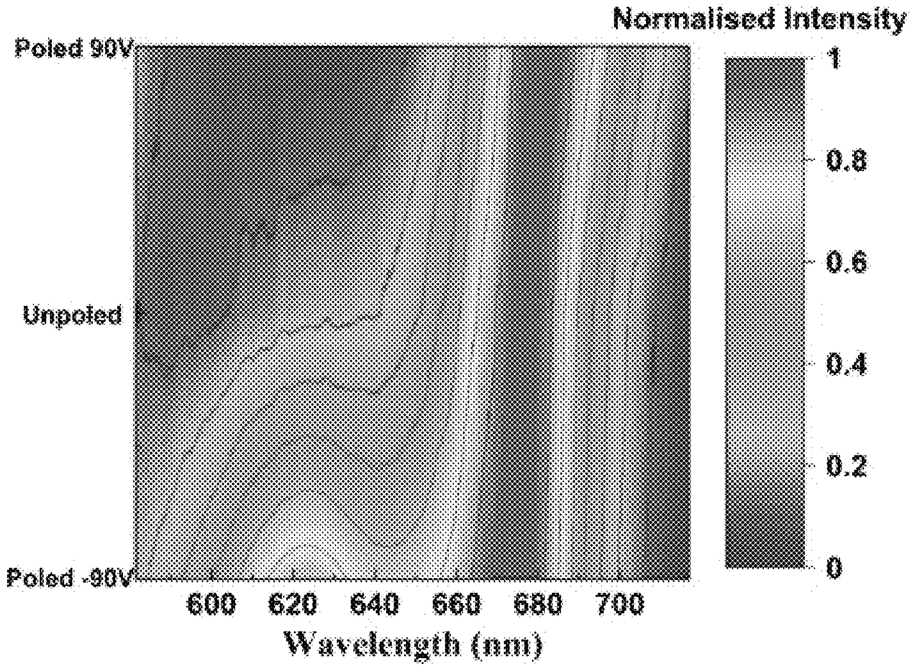

FIGS. 5A-C show results of experiments performed according to some embodiments of the present invention to investigate polarization dependent Photoluminescence (PL). FIG. 5A shows PL spectra of $\alpha$-$In_2Se_3$—$MoS_2$ heterostructure at various gate voltages, FIG. 5B shows a contour map of the normalized PL intensities at various applied gate voltages, and FIG. 5C shows a contour map of the normalized PL intensities, 10 mins following the withdrawal of the applied gate voltage, demonstrating the retention of the polarization induced PL.

Figure 6:
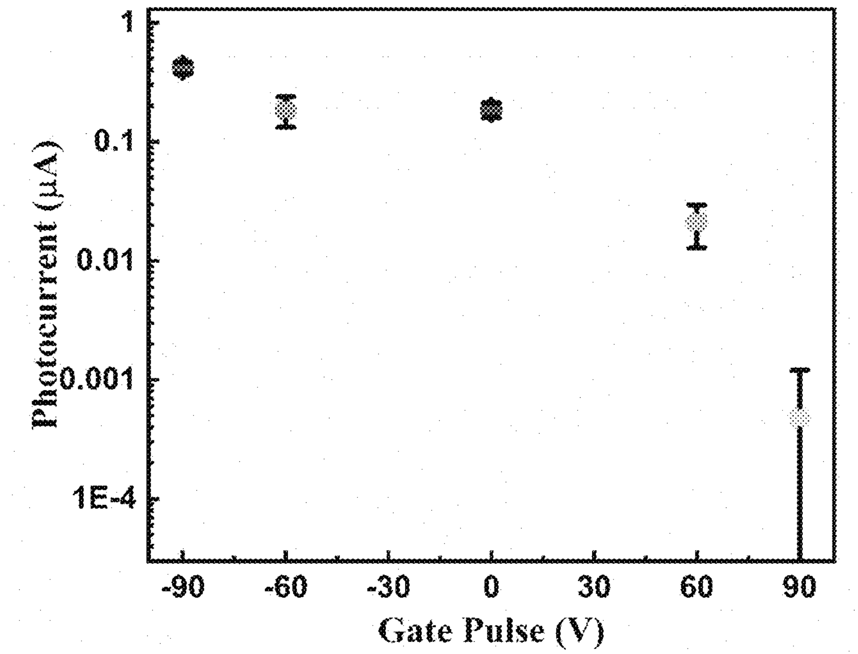

FIG. 6 shows photocurrent in a FeFET as a function of poling gate voltage, as obtained in experiments performed according to some embodiments of the present invention.

Figure 7:
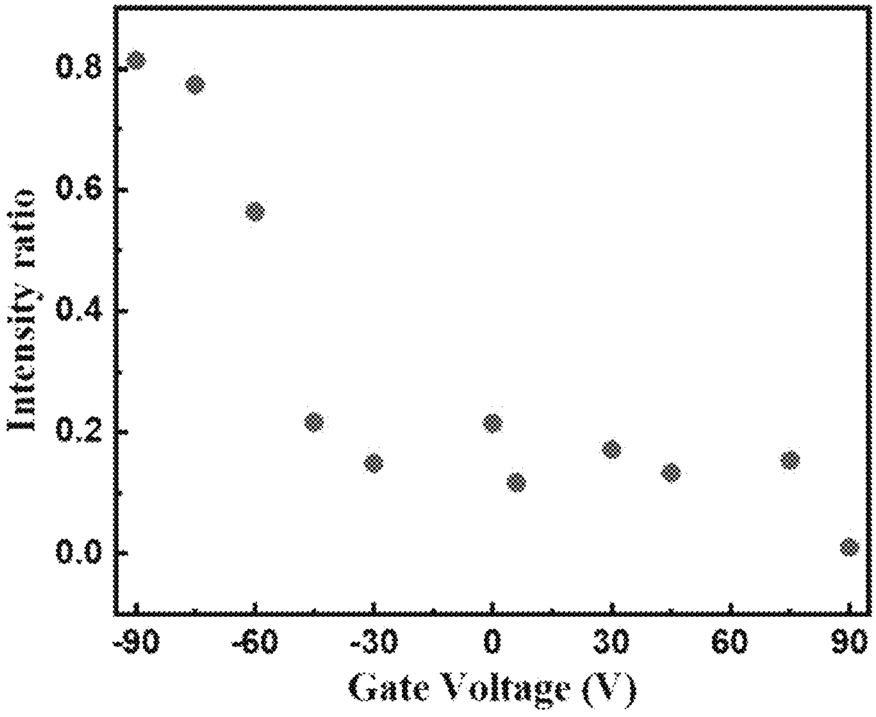

FIG. 7 shows evolution of B-peak intensity as a function of poling voltage, as obtained in experiments performed according to some embodiments of the present invention.

Figure 8:
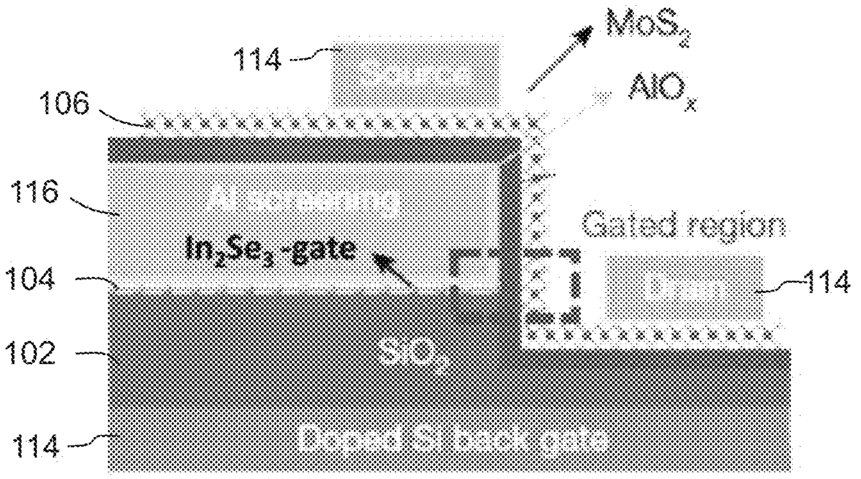

FIG. 8 is a schematic illustration of a heterostructure system in embodiments of the present invention in which the system comprises a polarization screening layer (aluminum in this case).

Figure 9:
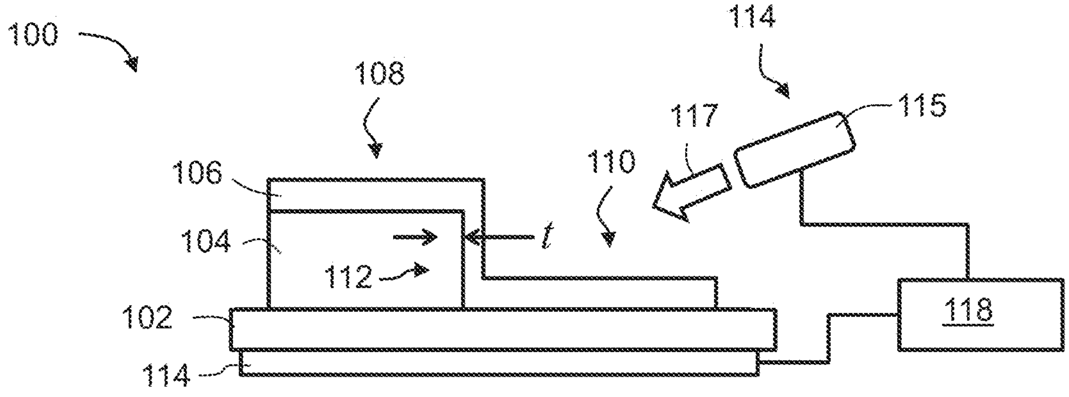

FIG. 9 is a schematic illustration of a heterostructure system, according to some embodiments of the present invention.

Figure 10:
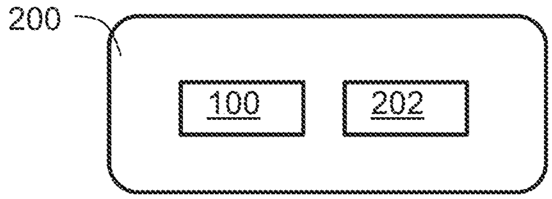

FIG. 10 is a schematic illustration of an appliance device that incorporates heterostructure system, according to some embodiments of the present invention.

Figure 11:
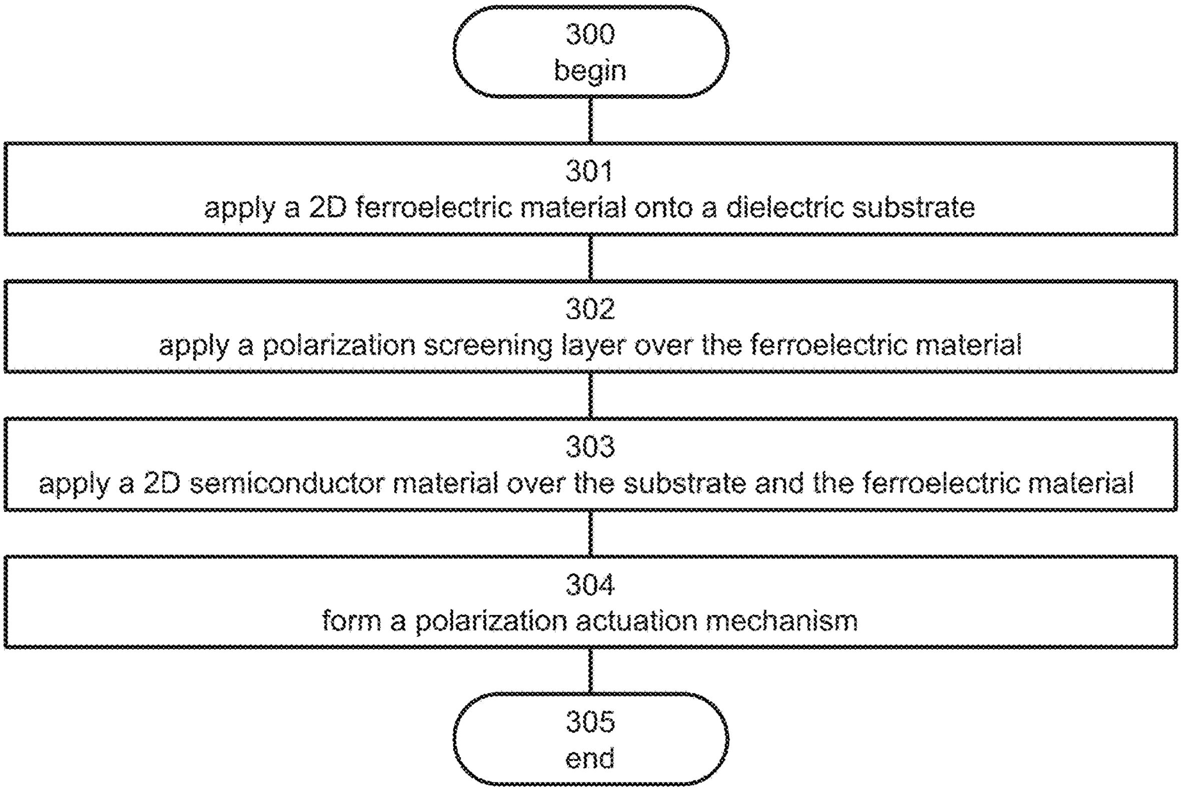

FIG. 11 is a flowchart diagram of a method suitable for fabricating a heterostructure system, according to various exemplary embodiments of the present invention.

DESCRIPTION OF SPECIFIC EMBODIMENTS OF THE INVENTION

The present invention, in some embodiments thereof, relates to heterostructures and, more particularly, but not exclusively, to a heterostructure having non-volatile actuatable polarization.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 9 illustrates a heterostructure system 100, according to some embodiments of the present invention. It is to be understood that the elements are shown exaggeratedly in FIG. 9 and their dimensions are not to scale.

Heterostructure system 100 comprises a dielectric substrate 102. Dielectric substrate 102 serves for providing a mechanical support for the other components of system 100. Representative examples of materials suitable for use as substrate 102 include, without limitation, $SiO_2$ (e.g., single-crystal silicon dioxide), $Si_3N_4$, AlN, Borosilicate, Fused Silica, a ceramic material (e.g., $Al_2O_3$, BeO, $ZrO_2$), and GaAs. Also contemplated are polymer substrates, such as, but not limited to, FR-4 substrate and polyimide substrate.

System 100 further comprises a two-dimensional ferroelectric material 104 on dielectric substrate 102. Preferably, and as shown in FIG. 9, ferroelectric material 104 occupy only a portion of the surface of substrate 102.

As used herein "a ferroelectric material" is a crystalline material that exhibits electric polarization even in the absence of an external electric field.

A polarization in the absence of an external electric field is referred to in the literature as "spontaneous polarization." The crystal structure of a ferroelectric material is typically asymmetric crystal structure, allowing the creation of electric dipoles within the crystal lattice. The crystal structure is asymmetric in the sense that there is a lack of inversion symmetry in the arrangement of the atoms in the lattice. This lack of symmetry results in a situation in which the electric charges within the lattice are not perfectly balanced, causing some of the atoms to develop a permanent electric dipole moment. In the absence of an external electric field, these dipoles can align themselves in a particular direction, creating a net electric polarization within the material.

As used herein "two-dimensional material" refers to a material having a crystal structure and a thickness of no more than one unit cell characterizing the crystal structure. A unit cell of a crystal structure is composed of an integer multiple (oftentimes denoted Z in the scientific literature) of formula units. This definition encompasses also the special case in which the integer multiple Z equals 1, in which case the unit cell of the respective crystal structure is composed of a single formula unit.

Thus, "a two-dimensional ferroelectric material" is a crystalline material that exhibits electric polarization even in the absence of an external electric field, and that has a thickness of no more than one unit cell characterizing its crystal structure.

Representative examples of materials suitable for use as ferroelectric material 104 include, without limitation, $In_2Se_3$, $CuInP_2S_6$, $CuInP_2Se_6$, $CuCrP_2S_6$, and $CuCrP_2Se_6$.

The height of ferroelectric material 104 above the surface of the substrate 102 is typically from about 1 nm to about 100 nm. In some embodiments of the present invention ferroelectric material 104 is a monolayer.

System 100 further comprises a two-dimensional semiconductor material 106. The semiconductor material can be of any type known in the art, but in some embodiments of the present invention it is a type of Transition Metal Dichalcogenide (TMD), which is defined as a compound that has a layered crystal structure and that is composed of a transition metal, such as, but not limited to, tungsten, molybdenum, titanium, vanadium, chromium, cobalt, nickel, zirconium, yttrium, niobium, technetium, palladium, hafnium, tantalum, metal, rhenium, iridium, platinum, gold, combined with a chalcogen element, such as, but not limited to, sulfur, selenium, and tellurium.

Representative examples of transition metal dichalcogenide suitable for use as semiconductor material 106, include, without limitation, $MoS_2$, $WSe_2$, $WS_2$, $MoSe_2$, $TiS_2$, $TiSe_2$, $TiTe_2$, $VS_2$, $VSe_2$, $VTe_2$, $CrS_2$, $CoTe_2$, $NiTe_2$, $ZrS_2$, $ZrSe_2$, $YSe_2$, $NbS_2$, $NbSe_2$, $NbTe_2$, $TcS_2$, $TcSe_2$, $TcTe_2$, $PdS_2$, $PdSe_2$, $PdTe_2$, $LaSe_2$, $HfS_2$, $HfSe_2$, $HfTe_2$, $TaS_2$, $TaSe_2$, $TaTe_2$, $WS_2$, $WSe_2$, $WTe_2$, $ReS_2$, $ReSe_2$, $IrTe_2$, $PtS_2$, $PtSe_2$, $PtTe_2$ and $AuTe_2$.

Semiconductor material 106 preferably has a first region 108 that is disposed over ferroelectric material 104 and a second region 110 that is disposed over a part of dielectric substrate 102 that is not occupied by the ferroelectric material 104. An edge 112 of ferroelectric material 104 is thus defined between first region 108 and second region 110 of semiconductor material 106. Note that semiconductor material 106 is disposed also over edge 112. The thickness t of edge 112, as measured parallel to substrate 102, is typically in the nanometer range (e.g., from about 0.9 nm to about 2 nm).

Ferroelectric material 104 and semiconductor material 106 are optionally and preferably attached to each other by van der Waals forces. The height of semiconductor material 106 above the upper surface of ferroelectric material 104 is typically from about 1 nm to about 100 nm. In some embodiments of the present invention semiconductor material 106 is a monolayer. Preferably, the height of semiconductor material 106 above the upper surface of ferroelectric material 104 is approximately the same as its height above the substrate 102.

In some embodiments of the present invention materials 104 and 106 are selected such that when the polarization of material 104 is at one state, first region 108 has doped properties and when the polarization of material 104 is at an opposite state, first region 108 has intrinsic properties.

In some embodiments of the present invention the materials 104 and 106 are selected such that when the polarization of material 104 is at one state, the first region 108 has conductive properties of a first polarity, and when the polarization of material 104 is at an opposite state, the first region 108 has conductive properties of a second polarity, where the second polarity is opposite to the first polarity. For example, the conductive properties of the first polarity, can be electron doped properties, and the conductive properties of the second polarity, can be hole doped properties.

System 100 optionally and preferably compromises a polarization actuation mechanism 114 for actuating non-volatile polarization at edge 112 of ferroelectric material 104. FIG. 9 illustrates polarization actuation mechanism 114 as a back gate electrode, allowing electrical polarization actuation, but mechanism 114 can be embodied also in other ways. For example, in some embodiments of the present invention mechanism 114 can comprise a top gate electrode (not shown) in contact, e.g., with region 108 of semiconductor material 116. Also contemplated, are embodiments in which mechanism 114 comprises a source electrode and a drain electrode connected to semiconducting material. For example, the source electrode can be in contact with region 108 and the drain electrode can be in contact with region 110 as schematically illustrated in FIG. 8. System 100 can optionally and preferably comprise a controller 118 which is configured to apply voltage to polarization actuation mechanism 114 wherein the voltage is selected to modulate the charge concentration in the region of semiconductor material 106 that is in contact with edge 112. Further contemplated are embodiments in which polarization actuation mechanism 114 is a light source 115 allowing optical polarization actuation. Optionally and preferably, controller 118 is configured to control the operation of light source 115. Light source 115 emits a light beam 117 which can be either a continuous wave (CW) light beam or a pulsed light beam, as desired. Pulsed light beam is advantageous because the parameters of the pulses (pulse width, pulse energy, pulse duty cycle, etc.) can be selected to induce partial polarization for multi-level states. The wavelength of beam 117 can be any wavelength from an infrared wavelength to ultraviolet wavelength. The wavelength preferably selected based on the bandgap of the ferroelectric material and/or the excited phonons in the ferroelectric and/or semiconductor materials.

Polarization actuation mechanism 114 can be configured to invert an in-plane and/or an out-of-plane polarization of ferroelectric material 104 and to modulate charge concentration in the region of semiconductor material 106 that is in contact with edge 112.

For example, when polarization actuation mechanism 114 is a back gate electrode, the application of negative voltage to the gate electrode can lead to repulsion of electrons and formation of a 'i' type region in semiconductor material 106, the application of positive voltage to the gate electrode can lead to attraction of electrons leading to the formation of 'n' type region in semiconductor material 106. The inventors found that in the latter case, a narrow 'i' type region is formed at the region of the semiconductor material 106 that contacts edge 112.

In some embodiments of the present invention system 100 comprises a polarization screening layer 116, between the ferroelectric material and the semiconductor material. A representative example of this embodiment is illustrated in FIG. 8. The polarization screening layer 116 preferably comprises a conductive element made of a metal, such as, but not limited to, aluminum. According to some embodiments of the invention the polarization screening layer 116 is between the ferroelectric material 104 and the semiconducting material 106 but not between the semiconductor material 106 and the dielectric substrate 102. In embodiments in which polarization actuation mechanism 114 provides optical polarization, screening layer 116 is preferably made transparent to beam 117. For example, layer 116 can be a graphene or the like.

FIG. 10 is a schematic illustration of an appliance device 200, that incorporates system 100. Appliance device 200 can be any appliance that employs system 100, for example, by utilizing polarization switching. Representative examples include, without limitation, a field effect transistor, a transducer (e.g., an optical transducer), a sensor (e.g., photosensor), a non-volatile memory, a neuromorphic device, an in-memory computing device, and an energy harvesting device.

For example, appliance device 200 can be a non-volatile memory in which the edge 112 can be polarized (for example, by means of voltage applied by controller 118). The part of the semiconductor material between the source and drain electrodes (see FIG. 8) can be the channel of the transistor, which can conduct current when a voltage is applied between the source and the drain. To read the data stored in device 200, the gate can be applied by a voltage that is insufficient to switch the polarization of the edge 112 but is sufficient to modulate the conductivity of the channel. The source-drain current depends on the polarization state of the edge 112. In one polarization state, the channel may be more conductive, resulting in a higher source-drain current, while in the other polarization state, the channel may be less conductive, resulting in a lower source-drain current.

Appliance device 200 can be an in-memory computing device, which can employ the above non-volatile memory principle. The in-memory computing device can include one or more memory cells that store data in a non-volatile manner as further detailed hereinabove. Some of these memory cells can operate within a non-volatile memory tier of the in-memory computing device, where data that needs to be preserved across power cycles is stored. Some of these memory cells can be utilized for data caching and acceleration of frequently accessed data. System 100 of appliance device 200 can be configured to behave concurrently as a non-volatile memory and a logic device with inherent compatibility, for example, with Boolean signaling. This can reduce the complexity and energy consumption of the interface with logic gates. Additionally, System 100 of appliance device 200 can provide a memory operation without static current during a write operation. Also contemplated are embodiments in which appliance device 200 is a memory cell that includes, aside from system 100, also a logic circuit 202. This allows data to be computed locally without the need to move data outside the memory cell 200. In these embodiments, internal readings are performed in order to execute operations on data stored in different cells, by exploiting inter-cells connections.

Appliance device 200 can be a neuromorphic device in which a plurality of systems such as system 100 can be used to model synapses, and be programmed by changing the polarization state of edge 112. This allows the weights of connections between neuromorphic units, such as, but not limited to, CMOS transistors, digital logic gates, and the like.

Appliance device 200 can be a photo-sensor, wherein photo-generated electron-hole pairs affect the polarization of edge 112. The change in polarization state is proportional to the incident light intensity and duration. This change can be detected, e.g., as further detailed hereinabove with respect to the non-volatile memory, thereby providing an electrical signal that is responsive to the incident light.

FIG. 11 is a flowchart diagram of a method suitable for fabricating a heterostructure system, such as, but not limited to, system 100, according to various exemplary embodiments of the present invention. It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The method begins at 300 and optionally and preferably continues to 301 at which applying a two-dimensional ferroelectric material (e.g., material 104) is applied onto a dielectric substrate (e.g., substrate 102). In some embodiments of the present invention the method continues to 302 at which a polarization screening layer (e.g., layer 116) is applied on the ferroelectric material. The method optionally and preferably continues to 303 at which a two-dimensional semiconductor material (e.g., material 106) is applied on the polarization screening layer (when applied) or the dielectric substrate (when 302 is not executed), as well as on the ferroelectric material. The semiconductor material is applied in a manner that a first region (e.g., portion 108) of the semiconductor material is over the ferroelectric material and a second region (e.g., portion 110) is over the dielectric substrate, wherein an edge of the ferroelectric material is between the first region and the second region of the semiconductor material. The method optionally and preferably continues to 304 at which a polarization actuation mechanism (e.g., mechanism 114) contacting at least one of the semiconductor material and the dielectric substrate is formed, to allow electrical actuation of non-volatile polarization at the edge of the ferroelectric material. Alternatively or additionally, a light source can be positioned to illuminate at least the edge by light to allow optical actuation of non-volatile polarization at the edge.

The method ends at 305. Further details regarding the fabrication method are described in the Examples section that follows.

As used herein the term "about" refers to ±10%

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Multilevel (Opto)Electronic Response in 2D $\alpha$-$In_2Se_3$—$MoS_2$ Edge Based Ferroelectric Field Effect Devices Heterostructures based on two dimensional (2D) materials offer the possibility to achieve synergistic functionalities which otherwise remain secluded by their individual counterparts. This Example demonstrates utilization of ferroelectric polarization switching in $\alpha$-$In_2Se_3$ to engineer multilevel non-volatile conduction states in partially overlapping $\alpha$-$In_2Se_3$—$MoS_2$ based ferroelectric semiconducting field effect devices. The experiments described below demonstrate that the intercoupled ferroelectric nature of $\alpha$-$In_2Se_3$ allows to non-volatilely switch between n-i and n-i-n type junction configurations based on the edge state actuation mechanism of the present embodiments. This ability can be useful for atomic scale non-volatile device miniaturization. The possible polarization states demonstrated below provide enhanced photogenerated carriers' separation, resulting in photoresponse of about 1275 A/W in the visible range and non-volatile modulation of the bright A- and B-excitonic emission channels in the overlaying $MoS_2$ monolayer. The experimental results demonstrate that the switchable polarization in partially overlapping $\alpha$-$In_2Se_3$—$MoS_2$ based FeFETs can be used for fabricating multimodal, non-volatile nanoscale electronic and optoelectronic devices.

Introduction

Transition metal dichalcogenides (TMDCs) such as, but not limited to, $MoS_2$ are known two dimensional (2D) semiconductor materials that are useful due to their excellent ambient stability[1,2], high mobility[3,4], high on-off ratio[5,6] and superior photo-responsivity[7,8]. Due to their considerable band gaps, these materials are useful for fabricating multi-modal electronic devices[9]. One of the ways to non-volatilely control the conduction states in operational field effect devices based on 2D materials, is the fabrication of hetero-structures with ferroelectric. Such device geometry is useful for various advanced applications in the form of field effect devices (FETs)[10], transducers[11], sensors[12], non-volatile memory[13], neuromorphic[14,15], energy harvesting devices[16] etc. The Inventors found that while traditional piezoelectric materials based on $BaTiO_3$, $BiFeO_3$, and $Pb(Zr,Ti)O_3$ have been used in such applications[17-20], the presence of truncated interfaces which are laden with interfacial electronic states strongly degrades the electronic characteristics compared to the pristine material's form, particularly when scaling down the device dimensions. The inventors found that a ferroelectric material in 2D form can overcome such challenges The atomically thin nature of 2D heterostructures can also be used for atomic-scale modulation of the local electronic properties across the material's edges, and for fabrication of a sub-nm gate length in vertical $MoS_2$ devices[21].

2D ferroelectrics that are characterized by the presence of exclusively out-of-plane (OOP) or in-plane (IP) polarization include, but are not limited too, $CuInP_2S_6$[22], 1T-$WTe_2$[23], SnTe[24] etc. Another such 2D ferroelectric is $In_2Se_3$ has which is known to have stable intercoupled IP and OOP ferroelectricity down to the monolayer limit[25-33]. The origin of the ferroelectricity in $\alpha$-$In_2Se_3$ arises from the relative displacement of the central Se atomic layer with respect to the adjacent In atomic layers, which breaks the centrosymmetry in the crystal and results in two energetically degenerate polarization states[31]. This character of $In_2Se_3$ can utilized in many applications such as, but not limited to, artificial intelligence, information processing and memory applications. Moreover, its high optical absorption[34], strong photoresponse[35] and phase-dependent visible to infrared bandgap[36] become advantageous from an optoelectronics point-of-view.

This Example studies the optoelectronic characteristics of vdW heterostructures based on ferroelectric $In_2Se_3$ and semiconducting $MoS_2$. In particular, the device channel is made from either monolayer or few layers $MoS_2$, while a thin (about 50 nm) layer of $In_2Se_3$ is inserted beneath half of the device channel in between the $MoS_2$ and the $SiO_2$ dielectric (FIG. 1A,B).

The experiments described below exhibit that selective poling of the $In_2Se_3$ can significantly modulate the conduction in the $MoS_2$ channel leading to distinct "ON" and "OFF" states with a maximum ratio of about 50 for poling gate voltages of ±90 V. The below experiments also demonstrate nonvolatile multilevel photoresponse following different poling conditions with the highest photoresponsivity of about 1275 A/W following an applied negative gate voltage of −90 V, which is higher than previous reports using either $MoS_2$ or $In_2Se_3$ based optoelectronic devices[7,8,37-40]. Using Kelvin probe force microscopy (KPFM), the observed modulation in the device conductivity and photoresponsivity is shown to correspond to a potential modulation across the device channel caused by the $\alpha$-$In_2Se_3$ poling conditions (FIG. 1C,D). In particular, the intercoupled ferroelectric polarization actively actuates the channel carrier concentration in the $MoS_2$ leading to non-volatile switching between a diode like n-i and a nanometric scale n-i-n junctions. The latter is rationalized by the edge induced junction mechanism of the present embodiments that provides FeFETs with ultra-short semiconductor channels, similar to recently reported device architecture[21]. This Example also demonstrates that heterostructure FeFETs based on monolayer $MoS_2$ exhibit non-volatile poling dependent photoluminescence (PL) of the bright A- and B-excitonic channels that are rationalized by the dipolar polarization and induced changes in carrier concentration. The dipole modulated FeFETs of the present embodiments can be utilized to fabricate functional multimodal optoelectronic memory devices with atomically narrow channel dimensions having far-reaching potential for logic, memory, neuromorphic and optoelectronic applications.

Methods

Sample Preparation

Mechanical exfoliation of $\alpha$-$In_2Se_3$ (2D Semiconductors) and $MoS_2$ (Manchester Nanomaterials) was conducted with crystals of about 4-6 mm in diameter. For both materials, the first few layers of the bulk crystal were mechanically cleaved to discard native oxide layers on the surface and then the pristine bulk was consequently cleaved to exfoliate flakes. The exfoliated flakes were then transferred onto a pre-patterned degenerately p-doped silicon substrate with 300 nm thermal Si oxide. A two-stage dry transfer method was used to fabricate the heterostructure using a viscoelastic Polydimethylsiloxane (PDMS)—Polypropylenecarbonate (PPC) stamp fitted on a three-axis micrometer. To pick up the desired flake, the stamp was brought in contact with the flake and was heated at 50° C. to facilitate adhesion. Next, the stamp with the $MoS_2$ facing downwards was brought above the substrate with the pre-exfoliated $In_2Se_3$ and was then slowly brought in contact with the substrate. The substrate was then heated to 100° C. to allow adhesion between the 2D materials and the stamp was slowly lifted after cooling down back to room temperature leaving the $MoS_2$ in contact with the underlying $In_2Se_3$.

Growth and Wet Transfer of CVD Grown $MoS_2$ $MoS_2$ monolayers were grown by a space confined CVD approach[59,60]. In a typical growth process, $MoO_3$ (99.5%, Sigma Aldrich) and sulfur powders (99.95%, Sigma Aldrich) were used as the metal and the chalcogen precursors, respectively. A ceramic boat containing ~3.5 mg $MoO_3$ powder was placed at the center of a CVD furnace of 1-inch diameter. Following, a Si substrate with 300 nm thermal oxide was mounted on the same boat with its polished surface facing upwards. Few small pieces of mica sheets were also placed above the target substrate. The sulfur (~350 mg) boat was placed ~22 cm upstream from the $MoO_3$ source-growth substrate. 250 sccm of highly pure Ar (5N) carrier gas was purged into the quartz tube for 10 mins to initiate the process. The furnace temperature was then ramped upto 750° C. at 15° C. per minute with a flow of 30 sccm of Ar while the chalcogen was separately heated to 180° C. The growth time was kept for 5-10 mins at 750° C.

$MoS_2$ samples were then transferred onto any desired substrate by a wet transfer process which involved spin coating the $MoS_2$ monolayers with 0.5% wt polystyrene (PS) [450 mg of PS (mol. wt 280,000 g/mol) in 5 ml of Toluene] for 60 seconds at 3000 rpm. Following, the substrate was subjected to a two-step baking process: at 90° C. for 30 mins and 120° C. for 15 mins.

In order to delaminate the $MoS_2$/PS assembly from the substrate, a surface energy assisted transfer technique was adopted, where, a drop of water was poured on one of the exposed edges of the substrate, instantly releasing the assembly. Thereafter, the $MoS_2$/PS film was fished out with the Si/$SiO_2$ substrate and baked with the same previous conditions. Finally, toluene was used to dissolve the PS film.

Device Fabrication

Standard e-beam lithography [Raith-eLine] followed by electron beam evaporation [Evatec BAK 501A] of 5 nm of Cr and 50 nm of Au were used to fabricate the contact electrodes. Prior to the metal deposition, the sample was subjected to a mild oxygen plasma to remove unwanted resist residues [Low Pressure Plasma System—Diener PCCE] for ~5 seconds. The metal deposition rate was set to ~0.5 Å/s for Cr and ~1 Å/s for Au at the base pressure of ~$7\times10^{-7}$ torr.

Surface and Electrical Characterization

Atomic force microscopy (AFM) and Kelvin probe force microscopy (KPFM) measurements were conducted in an $N_2$ filled glovebox ($H_2O$ and $O_2$ content<1 ppm) (Dimension-Scanassist, Bruker Inc.) by frequency modulation (FM-KPFM) technique using conductive Pt/Ir-coated cantilever [PPP-EFM-50, NANOSENSORS™ with ~25 nm tip radius]. Semiconductor parameter analyzer [Keysight B1500A] and a probe station equipped with an optical microscope were used to electrically characterize the heterostructure FETs at room temperature in ambient atmosphere. A white light source (spectral range 420 nm-720 nm) with intensity of ~332 μW/cm$^2$ was used for the photoresponse measurements.

Spectroscopic Characterization

Raman and PL spectroscopy were used to characterize the individual 2D materials as well as their heterostructures using WITec Alpha 300R Raman Microscope in confocal mode comprising of 532 nm laser. A 100× objective (NA=0.9; Dl~360 nm, 600 g*mm$^{-1}$ grating) was used to focus the laser beam, while keeping the excitation power at ~1 mW to avoid degradation of the material.

Calculation of Hysteresis Window

Hysteresis width was calculated by the following formula:

$$H.W. = V_{\frac{I_{max}}{2}(retrace)} - V_{\frac{I_{max}}{2}(retrace)} \quad \text{(EQ. 1)}$$

where, $$V_{\frac{I_{max}}{2}(retrace)}$$

is the voltage at which the current in the channel is half of the max during the retrace cycle of the measurement, and $$V_{\frac{I_{max}}{2}(retrace)}$$

is the voltage at which the current in the channel is half of the max during the trace cycle of the measurement Calculation of Photocurrent The photocurrent was calculated using the following equation:

$$I_{ph} = I_{light} - I_{dark} \quad \text{(EQ. 2)}$$

The photoresponsivity, R(λ), of the photodetector was calculated using the following equation:

$$R(\lambda) = \frac{I_{ph}(\lambda)}{P_d} \quad \text{(EQ. 3)}$$

where, $J_{photo}$ is the photocurrent density and $P_d$ is the incident power on device.

Detectivity (D*), which is another parameter of a photodetector, can be expressed as $$D^* = \frac{R(\lambda)}{\sqrt{q * J_{dark}}} \quad \text{(EQ. 4)}$$

where, $J_{dark}$ is the dark current density and q is the electronic charge.

Results

Few layers of α-$In_2Se_3$ were first exfoliated onto degenerately p-doped Si substrate capped with 300 nm thermal oxide by a standard scotch tape method[41]. Similarly, few layers of $MoS_2$ were exfoliated onto $SiO_2$/Si and then deterministically transferred using a dry viscoelastic stamp[42] over the α-$In_2Se_3$ flake such that only half of the device channel is placed over the $In_2Se_3$ (FIG. 1A,B). E-beam lithography was used to fabricate source and drain contacts while the underlying p-doped Si was used as back-gate.

The atomic configuration of the $In_2Se_3$—$MoS_2$ heterostructure following the application of negative and positive back gate potentials are shown in FIGS. 1A and 1B, respectively. As shown, the atomic arrangement of the $In_2Se_3$ layer is modified by the different polarity of the applied field leading to alternating polarization states. For negative OOP poling, the central Se atom is vertically translated towards the bottom In atom leading to net OOP polarization in the downward (↓) direction as shown by the red arrow. For positive poling, the central Se atom vertically translates away from the bottom In atom leading to net OOP polarization in the upward (↑) as indicated by the red arrow. The IP polarizations are also subsequently modified as a result of the coupled nature leading to varying polarizations (→ and ← respectively).

Such dipolar variations induce charge carrier migration on the overlying $MoS_2$ leading to the formation of local regions with different charge carrier concentration. The inset of FIGS. 1A and 1B show the corresponding carrier migration due to dipolar environments. For negative poling, the OOP dipole (oval with green body) is directed such that the negative charge center is in proximity to the overlying $MoS_2$, leading to repulsion of electrons and formation of a 'i' type region, which is verified by the measured potential profile shown in FIG. 1C. For positive poling, the specific dipolar arrangement with the positive charge center in proximity to the overlying $MoS_2$ attracts electrons leading to the formation of 'n' type region (FIG. 1D). In this configuration, the specific orientation of the IP dipoles (oval with red body) leads to the formation of a narrow 'i' type region, right across the material edge (discussed in detail below).

FIG. 1E shows the AFM topography of the heterostructure device and its height profile along the red dotted line. The height of the exfoliated $MoS_2$ is ascertained to be about 25 nm, whereas the cumulative height of the $In_2Se_3/MoS_2$ structure is about 75 nm The thickness of the $In_2Se_3$ is therefore about 50 nm.

FIG. 1F shows the Raman spectra obtained from various regions in the heterostructure device and its optical image (inset image). The Raman spectra for the $MoS_2$ region has two distinct peaks at about 385 $cm^{-1}$ and about 407 $cm^{-1}$, which correspond to the $E^1_{2g}$ and $A_{1g}$ modes[5], respectively. Over the heterostructure region, along with the peaks for $MoS_2$, additional peaks are observed at about 105 $cm^{-1}$, about 178 $cm^{-1}$ and about 192 $cm^{-1}$ that correspond to $A_1$(LO+TO), $A_1$(LO) and $A_1$(TO) phonon modes in $\alpha$-$In_2Se_3$[27,43,44], respectively. The presence of the $A_1$(LO) and $A_1$(TO) peaks caused by the LO–TO splitting indicate the lack of inversion symmetry and the ferroelectric nature in the $\alpha$-$In_2Se_3$[29] crystal. For comparison, the Raman spectrum of the pre-transferred $\alpha$-$In_2Se_3$ is also shown in the FIG. 1F.

The ferroelectric polarization in 2D $In_2Se_3$ and its subsequent control by gate voltage can be utilized to modulate the electronic band structure of the FeFET[45] and in particular the optoelectronic characteristics of the adjacent $MoS_2$ semiconducting channel. The dipole induced non-volatile device characteristics was investigated by performing electrostatic poling of the $In_2Se_3$ where a particular gate bias voltage pulse was applied for a duration of 30 sec. FIG. 2A shows the measured current-voltage output characteristics of the FeFET following three different poling conditions, viz., unpoled and poled at ±90 V (measurements took place 2 min after the withdrawal of gate bias voltage). The switching voltages are relatively high and allow complete polarization switching. This is attributed to the 300 nm $SiO_2$ dielectrics that results in weaker induced vertical electric field across the device channel[29,45]. A significant modulation of the channel conductance is clearly observed due to the different poling conditions. In particular, following positive (negative) gate poling, in which the polarization in the underlying $\alpha$-$In_2Se_3$ points upwards (downwards) the $MoS_2$, the conductivity of the channel decreases (increases) significantly, realizing two distinct stable conduction states i.e., "ON" and "OFF" states. The I-V profile shows a diode like behavior following negative gate poling, which is attributed to the junction formation between the $In_2Se_3$ supported- and the unsupported $MoS_2$ regions, as discussed below. Counterintuitively, a low channel conductance state following positive gate poling was observed, whereas an increase in electron concentration in the $MoS_2$ channel was expected considering the obtained dipole polarization. Such device characteristics are explained by the Inventor by the edge state actuation mechanism of the present embodiments, leading to an abrupt potential barrier at the center of the device channel, as discussed below.

FIG. 2B shows the transfer characteristics of the device for different gate voltage sweep ranges. A progressively increasing hysteretic behavior (see FIG. 2B) is observed with respect to the applied sweep range (inset of FIG. 2B). Such transfer characteristics are attributed to the ferroelectric nature of $\alpha$-$In_2Se_3$[15,46], and can be used to substantially affect the conductivity of the $MoS_2$ channel, thereby realizing non-volatile memory operation (note that the measured current values are significantly larger, about 10 μA, in comparison with typical current levels for $In_2Se_3$ based FET devices, which are in the pA range, indicative for the negligibly low current flow through the $In_2Se_3$ layer.

The retention and stability of the "ON" and "OFF" states in the FeFETs can be evaluated from the time resolved current measurements following alternating poling conditions. The retention characteristics were measured following 30 sec gate voltage pulses of ±90 V and are depicted in FIG. 2C. As shown, two distinct conduction states are maintained for a read voltage of 0.1 V with negligible $I_{ON}/I_{OFF}$ degradation for at least one hour. Linear extrapolation of the current levels in the logarithmic time scale shows that the ratio of the two conduction states is expected to remain about 10, even after a time period of more than a year, showing the ability of the device of the present embodiments to retain data for prolonged time periods. Device endurance was characterized by recording the current value for an applied drain bias voltage of 0.1 V, 2 min following the application of alternating gate poling voltages of ±90 V for over 100 cycles (FIG. 2D). The current level for both $I_{ON}$ and $I_{OFF}$ states exhibit no sign of deviation, retaining an ON/OFF ratio of about 60 following 100 cycles of alternating poling conditions. The experimental results show that by controlling the polarization state of the ferroelectric $In_2Se_3$, the FeFET of the present embodiments can be used as a non-volatile memory switch. The observed diode-like characteristics following negative gate voltage actuation demonstrates formation of a lateral n-i junction across the $MoS_2$ channel[47], which is useful, for example, for photodetection applications.

The functionality of the FeFET of the present embodiments for photodetection applications was assessed by analyzing polarization dependent photoresponse of the FeFET where the FeFET was subjected to an alternating illumination using a white light source (from about 420 nm to about 720 nm) following different gate pulses (FIG. 3A). FIG. 3B shows a zoomed in of a region that is marked by the black dotted box in the current vs. time plot of FIG. 3A. The calculated photocurrent (see methods section) is substantially affected by the induced polarization. It is noted that while a relatively modest photoresponsivity of about 1.46 A/W was achieved following a positive gate pulse of +90 V, a maximum of about 1275 A/W was recorded following negative gate pulse of −90 V. Such extraordinary increase (about 3 orders of magnitude) in photoresponse is attributed to the formation of a lateral n-i junction across the device, as discussed below. The calculated detectivity similarly present relatively high values of about $12\times10^{11}$ Jones following a gate pulse of −90 V.

The underlying conduction modulation mechanism can be understood from the results of the local surface potential measurements by frequency modulated KPFM. FIGS. 4A and 4B show the surface potential and topography profiles across the $MoS_2$ channel taken 2 mins following two extreme poling conditions of −90 V and +90 V, respectively for 4 consecutive cycles. The source and drain electrodes are marked with a golden yellow box. The dipolar orientation of the $In_2Se_3$ is modulated as a result of the electrostatic gating impulse. The corresponding crystal orientations of the $In_2Se_3$—$MoS_2$ heterostructure following negative and positive gate poling are shown in the inset of FIGS. 4A and 4B, respectively. FIGS. 4C and 4D show the surface potential maps of the FeFET following withdrawal of −90 V and +90 V applied gate voltages showing distinct n and i regions. As shown, the surface potential across the $MoS_2$ section remains almost constant following both positive and negative gate poling, whereas a clear change in surface potential is observed atop the heterostructure. An abrupt potential modulation was observed at the center region of the device channel right at the onset of the heterostructure section following positive gate poling. Such potential variations correspond to the formation of a lateral n-i-n junction as shown in FIG. 4D. An explanation suggested by the Inventors for such junction formation is schematically described in FIG. 4F, where due to the positive poling, the OOP dipoles in the α-$In_2Se_3$ orient such that the polarization is directed towards the hetero-interface, as denoted by the red arrows in FIG. 4F. This orientation of the dipolar field corroborates to the accumulation of negative charges in the $MoS_2$. The intercoupled IP polarization results in an abrupt charge modulation right across the $In_2Se_3$ edge leading to a local potential barrier at the center of the $MoS_2$ channel. Such potential modulation results in a robust "OFF" state as shown in the current voltage profile of FIGS. 2A and 2B. In contrast, following a negative gate poling, when the dipoles orient such that they are directed away from the α-$In_2Se_3$—$MoS_2$ hetero-interface (denoted by red arrows in FIG. 4E), an energy gap of 1.95 eV was measured across the junction. Such dipolar orientation depletes negative charges in the $MoS_2$ leading to the formation of an n-i junction (FIG. 4E), in agreement with the diode-like characteristics shown in FIG. 2A and the excellent photoresponsivity that is observed for such poling conditions.

The presence of alternating dipolar field at the interface between $In_2Se_3$ and $MoS_2$ can impact the PL of monolayer $MoS_2$. FIG. 5A shows the PL spectra measured atop the heterostructure section fabricated with monolayer CVD $MoS_2$ at various applied back-gate voltages and FIG. 5B shows the contour map of the PL intensities after normalization with respect to the A-exciton peak. As shown, there is a significant enhancement of the PL signal for negative poling that is characterized by a relatively lower electron concentration in the $MoS_2$ channel. Such PL enhancement has been shown in $MoS_2$ based field effect devices[48] and in ferroelectric Lithium Niobate ($LiNbO_3$) based $MoSe_2$ heterostructures[49]. A significant enhancement of the B-excitonic peak is observed for negative poling, which becomes almost completely muted for positive poling (see FIGS. 2A-D). An explanation suggested by the Inventors for such B exciton emission enhancement is the strong presence of dipole polarization in $In^2Se^3$ that is not sufficiently screened due to the low carrier concentration in the $MoS_2$, in comparison to strong dipole screening following positive gate poling[50-52]. The time retention of these states was tested by measuring PL also 10 mins after poling. Similarly to the measured potential and charge transport characteristics, PL measurements also showed significant retention, as shown from the contour map in FIG. 5C.

CONCLUSIONS

The Experimental results demonstrated non-volatile control over the optoelectronic properties in α-$In_2Se_3$—$MoS_2$ based vdW FeFETs. The gate controlled ferroelectric polarization can efficiently influence the carrier concentration in the overlying $MoS_2$, leading to the formation of n-i-n and n-i junctions following positive and negative poling, respectively. An abrupt potential modulation across the heterostructure edge can be induced by the IP dipole polarization of the $In_2Se_3$, making it suitable for sub-nm semiconductor channeled FeFET comprising non-volatile memory characteristics. The local charge carrier engineering and subsequent junction formation was experimentally verified by surface potential measurements based on FM-KPFM. Superior photoresponse of about 1275 A/W under white light illumination has been achieved owing to the efficient separation of photogenerated carriers by the formation of an n-i junction. Distinct non-volatile modulation of the bright A- and B-excitonic emission channels was also demonstrated.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

REFERENCES

[1] Budania, P.; Baine, P.; Montgomery, J.; McGeough, C.; Cafolla, T.; Modreanu, M.; McNeill, D.; Mitchell, N.; Hughes, G.; Hurley, P. Long-Term Stability of Mechanically Exfoliated MoS2 Flakes. MRS Commun. 2017, 7 (4), 813-818.

[2] Fu, S.; Kang, K.; Shayan, K.; Yoshimura, A.; Dadras, S.; Wang, X.; Zhang, L.; Chen, S.; Liu, N.; Jindal, A.; Li, X.; Pasupathy, A. N.; Vamivakas, A. N.; Meunier, V.; Strauf, S.; Yang, E. H. Enabling Room Temperature Ferromagnetism in Monolayer MoS2 via in Situ Iron-Doping. Nat. Commun. 2020, 11 (1), 6-13.

[3] Kim, S.; Konar, A.; Hwang, W. S.; Lee, J. H.; Lee, J.; Yang, J.; Jung, C.; Kim, H.; Yoo, J. B.; Choi, J. Y.; Jin, Y. W.; Lee, S. Y.; Jena, D.; Choi, W.; Kim, K. High-Mobility and Low-Power Thin-Film Transistors Based on Multilayer MoS2 Crystals. Nat. Commun. 2012, 3.

[4] Radisavljevic, B.; Kis, A. Mobility Engineering and a Metal-Insulator Transition in Monolayer MoS2. Nat. Mater. 2013, 12 (9), 815-820.

[5] Wu, W.; De, D.; Chang, S. C.; Wang, Y.; Peng, H.; Bao, J.; Pei, S. S. High Mobility and High on/off Ratio Field-Effect Transistors Based on Chemical Vapor Deposited Single-Crystal MoS2 Grains. Appl. Phys. Lett. 2013, 102 (14).

[6] Shih, C. J.; Wang, Q. H.; Son, Y.; Jin, Z.; Blankschtein, D.; Strano, M. S. Tuning On-off Current Ratio and Field-Effect Mobility in a MoS2-Graphene Heterostructure via Schottky Barrier Modulation. ACS Nano 2014, 8 (6), 5790-5798.
[7] Liu, X.; Yang, X.; Gao, G.; Yang, Z.; Liu, H.; Li, Q.; Lou, Z.; Shen, G.; Liao, L.; Pan, C.; Lin Wang, Z. Enhancing Photoresponsivity of Self-Aligned MoS2 Field-Effect Transistors by Piezo-Phototronic Effect from GaN Nanowires. ACS Nano 2016, 10 (8), 7451-7457.
[8] Lopez-Sanchez, O.; Lembke, D.; Kayci, M.; Radenovic, A.; Kis, A. Ultrasensitive Photodetectors Based on Monolayer MoS2. Nat. Nanotechnol. 2013, 8 (7), 497-501.
[9] Mak, K. F.; Lee, C.; Hone, J.; Shan, J.; Heinz, T. F. Atomically Thin MoS2: A New Direct-Gap Semiconductor. Phys. Rev. Lett. 2010, 105 (13), 2-5.
[10] Chai, X.; Jiang, J.; Zhang, Q.; Hou, X.; Meng, F.; Wang, J.; Gu, L.; Zhang, D. W.; Jiang, A. Q. Nonvolatile Ferroelectric Field-Effect Transistors. Nat. Commun. 2020, 11 (1), 1-9.
[11] Lee, H. J.; Zhang, S.; Luo, J.; Li, F.; Shrout, T. R. Thickness-Dependent Properties of Relaxor-PbTiO3 Ferroelectrics for Ultrasonic Transducers. Adv. Funct. Mater. 2010, 20 (18), 3154-3162.
[12] Oh, S.; Hwang, H.; Yoo, I. K. Ferroelectric Materials for Neuromorphic Computing. APL Mater. 2019, 7 (9).
[13] Guo, R.; You, L.; Zhou, Y.; Lim, Z. S.; Zou, X.; Chen, L.; Ramesh, R.; Wang, J. Non-Volatile Memory Based on the Ferroelectric. Nat. Commun. 2013, 4 (May), 2-6.
[14] Gao, J.; Zheng, Y.; Yu, W.; Wang, Y.; Jin, T.; Pan, X.; Loh, K. P.; Chen, W. Intrinsic Polarization Coupling in 2D A-In 2 Se 3 toward Artificial Synapse with Multimode Operations. SmartMat 2021, 2 (December 2020), 88-98.
[15] Wang, L.; Wang, X.; Zhang, Y.; Li, R.; Ma, T.; Leng, K.; Chen, Z.; Abdelwahab, I.; Loh, K. P. Exploring Ferroelectric Switching in α-In2Se3 for Neuromorphic Computing. Adv. Funct. Mater. 2020, 30 (45), 1-9.
[16] Kang, W.; Huber, J. E. Prospects for Energy Harvesting Using Ferroelectric/Ferroelastic Switching. Smart Mater. Struct. 2019, 28 (2).
[17] Shen, Z.; Wang, X.; Luo, B.; Li, L. BaTiO3-BiYbO3 Perovskite Materials for Energy Storage Applications. J. Mater. Chem. A 2015, 3 (35), 18146-18153.
[18] Ren, X.; Fan, H.; Zhao, Y.; Liu, Z. Flexible Lead-Free BiFeO3/PDMS-Based Nanogenerator as Piezoelectric Energy Harvester. ACS Appl. Mater. Interfaces 2016, 8 (39), 26190-26197.
[19] Takayama, R.; Tomita, Y.; Iijima, K.; Ueda, I. Pyroelectric Properties and Application to Infrared Sensors of PbTiO3, PbLaTiO3 and PbZrTiO3 Ferroelectric Thin Films. Ferroelectrics 1991, 118 (1), 325-342.
[20] Lipatov, A.; Fursina, A.; Vo, T. H.; Sharma, P.; Gruverman, A.; Sinitskii, A. Polarization-Dependent Electronic Transport in Graphene/Pb(Zr,Ti)O3 Ferroelectric Field-Effect Transistors. Adv. Electron. Mater. 2017, 3 (7), 1-8.
[21] Wu, F.; Tian, H.; Shen, Y.; Hou, Z.; Ren, J.; Gou, G.; Sun, Y.; Yang, Y.; Ren, T. L. Vertical MoS2 Transistors with Sub-1-Nm Gate Lengths. Nature 2022, 603 (7900), 259-264.
[22] Liu, F.; You, L.; Seyler, K. L.; Li, X.; Yu, P.; Lin, J.; Wang, X.; Zhou, J.; Wang, H.; He, H.; Pantelides, S. T.; Zhou, W.; Sharma, P.; Xu, X.; Ajayan, P. M.; Wang, J.; Liu, Z. Room-Temperature Ferroelectricity in CuInP2S6 Ultrathin Flakes. Nat. Commun. 2016, 7, 1-6.
[23] Fei, Z.; Zhao, W.; Palomaki, T. A.; Sun, B.; Miller, M. K.; Zhao, Z.; Yan, J.; Xu, X.; Cobden, D. H. Ferroelectric Switching of a Two-Dimensional Metal. Nature 2018, 560 (7718), 336-339.
[24] Chang, K.; Liu, J.; Lin, H.; Wang, N.; Kun, Z.; Zhang, A.; Jin, F.; Zhong, Y.; Hu, X.; Duan, W.; Zhang, Q.; Fu, L.; Xue, Q.-K.; Chen, X.; Shuai-Hua, J. Discovery of Robust In-Plane Ferroelectricity in Atomic-Thick SnTe. Science (80-.). 2016, 353 (6296), 274-278.
[25] Wan, S.; Li, Y.; Li, W.; Mao, X.; Wang, C.; Chen, C.; Dong, J.; Nie, A.; Xiang, J.; Liu, Z.; Zhu, W.; Zeng, H. Nonvolatile Ferroelectric Memory Effect in Ultrathin α-In 2 Se 3. Adv. Funct. Mater. 2019, 29 (20), 1-7.
[26] Zheng, C.; Yu, L.; Zhu, L.; Collins, J. L.; Kim, D.; Lou, Y.; Xu, C.; Li, M.; Wei, Z.; Zhang, Y.; Edmonds, M. T.; Li, S.; Seidel, J.; Zhu, Y.; Liu, J. Z.; Tang, W. X.; Fuhrer, M. S. Room Temperature In-Plane Ferroelectricity in van Der Waals In2Se3. Sci. Adv. 2018, 4 (7), 1-8.
[27] Xue, F.; Hu, W.; Lee, K. C.; Lu, L. S.; Zhang, J.; Tang, H. L.; Han, A.; Hsu, W. T.; Tu, S.; Chang, W. H.; Lien, C. H.; He, J. H.; Zhang, Z.; Li, L. J.; Zhang, X. Room-Temperature Ferroelectricity in Hexagonally Layered α-In2Se3 Nanoflakes down to the Monolayer Limit. Adv. Funct. Mater. 2018, 28 (50), 1-7.
[28] Cui, C.; Hu, W. J.; Yan, X.; Addiego, C.; Gao, W.; Wang, Y.; Wang, Z.; Li, L.; Cheng, Y.; Li, P.; Zhang, X.; Alshareef, H. N.; Wu, T.; Zhu, W.; Pan, X.; Li, L. J. Intercorrelated In-Plane and Out-of-Plane Ferroelectricity in Ultrathin Two-Dimensional Layered Semiconductor In2Se3. Nano Lett. 2018, 18 (2), 1253-1258.
[29] Dutta, D.; Mukherjee, S.; Uzhansky, M.; Koren, E. Cross-Field Optoelectronic Modulation via Inter-Coupled Ferroelectricity in 2D In2Se3. npj 2D Mater. Appl. 2021, 5 (1), 1-8.
[30] Xue, F.; He, X.; Retamal, J. R. D.; Han, A.; Zhang, J.; Liu, Z.; Huang, J. K.; Hu, W.; Tung, V.; He, J. H.; Li, L. J.; Zhang, X. Gate-Tunable and Multidirection-Switchable Memristive Phenomena in a Van Der Waals Ferroelectric. Adv. Mater. 2019, 31 (29), 1-9.
[31] Xiao, J.; Zhu, H.; Wang, Y.; Feng, W.; Hu, Y.; Dasgupta, A.; Han, Y.; Wang, Y.; Muller, D. A.; Martin, L. W.; Hu, P.; Zhang, X. Intrinsic Two-Dimensional Ferroelectricity with Dipole Locking. Phys. Rev. Lett. 2018, 120 (22), 227601.
[32] Mukherjee, S.; Koren, E. Indium Selenide (In2Se3)—An Emerging Van-Der-Waals Material for Photodetection and Non-Volatile Memory Applications. Isr. J. Chem. 2022, 202100112.
[33] Ding, W.; Zhu, J.; Wang, Z.; Gao, Y.; Xiao, D.; Gu, Y.; Zhang, Z.; Zhu, W. Prediction of Intrinsic Two-Dimensional Ferroelectrics in In 2 Se 3 and Other III 2-VI 3 van Der Waals Materials. Nat. Commun. 2017, 8, 1-8.
[34] Quereda, J.; Biele, R.; Rubio-Bollinger, G.; Agraït, N.; D'Agosta, R.; Castellanos-Gomez, A. Strong Quantum Confinement Effect in the Optical Properties of Ultrathin α-In2Se3. Adv. Opt. Mater. 2016, 4 (12), 1939-1943.
[35] Mukherjee, S.; Dutta, D.; Mohapatra, P. K.; Dezanashvili, L.; Ismach, A.; Koren, E. Scalable Integration of Coplanar Heterojunction Monolithic Devices on Two-Dimensional In2Se3. ACS Nano 2020, 14 (12), 17543-17553.
[36] Collins, J. L.; Wang, C.; Tadich, A.; Yin, Y.; Zheng, C.; Hellerstedt, J.; Grubišić-Čabo, A.; Tang, S.; Mo, S.-K.; Riley, J.; Huwald, E.; Medhekar, N. V; Fuhrer, M. S.; Edmonds, M. T. Electronic Band Structure of In-Plane Ferroelectric van Der Waals B'—In2Se3. ACS Appl. Electron. Mater. 2020, 2 (1), 213-219.

[37] Zhang, K.; Peng, M.; Yu, A.; Fan, Y.; Zhai, J.; Wang, Z. L. A Substrate-Enhanced MoS2 Photodetector through a Dual-Photogating Effect. Mater. Horizons 2019, 6 (4), 826-833.

[38] Sun, B.; Wang, Z.; Liu, Z.; Tan, X.; Liu, X.; Shi, T.; Zhou, J.; Liao, G. Tailoring of Silver Nanocubes with Optimized Localized Surface Plasmon in a Gap Mode for a Flexible MoS2 Photodetector. Adv. Funct. Mater. 2019, 29 (26), 1-8.

[39] Kufer, D.; Nikitskiy, I.; Lasanta, T.; Navickaite, G.; Koppens, F. H. L.; Konstantatos, G. Hybrid 2D-0D MoS2-PbS Quantum Dot Photodetectors. Adv. Mater. 2015, 27 (1), 176-180.

[40] Wang, X.; Wang, P.; Wang, J.; Hu, W.; Zhou, X.; Guo, N.; Huang, H.; Sun, S.; Shen, H.; Lin, T.; Tang, M.; Liao, L.; Jiang, A.; Sun, J.; Meng, X.; Chen, X.; Lu, W.; Chu, J. Ultrasensitive and Broadband MoS2 Photodetector Driven by Ferroelectrics. Adv. Mater. 2015, 27 (42), 6575-6581.

[41] Novoselov, K. S.; Geim, A. K.; Morozov, S. V; Jiang, D.; Zhang, Y.; Dubonos, S. V; Grigorieva, I. V; Firsov, A. A. Electric Field Effect in Atomically Thin Carbon Films. Science (80-.). 2004, 306 (5696), 666 LP-669.

[42] Feng, W.; Jin, Z.; Yuan, J.; Zhang, J.; Jia, S.; Dong, L.; Yoon, J.; Zhou, L.; Vajtai, R.; Tour, J. M.; Ajayan, P. M.; Hu, P.; Lou, J. A Fast and Zero-Biased Photodetector Based on GaTe—InSe Vertical 2D p-n Heterojunction. 2D Mater. 2018, 5 (2).

[43] Lewandowska, R.; Bacewicz, R.; Filipowicz, J.; Paszkowicz, W. Raman Scattering in Alpha-In2Se3 Crystals. Mater. Res. Bull. 2001, 36 (15), 2577-2583.

[44] Igo, J.; Gabel, M.; Yu, Z. G.; Yang, L.; Gu, Y. Photodefined In-Plane Heterostructures in Two-Dimensional In2Se3 Nanolayers for Ultrathin Photodiodes. ACS Appl. Nano Mater. 2019, 2 (10), 6774-6782.

[45] Mukherjee, S.; Dutta, D.; Uzhansky, Michael; Koren, E. Monolithic In2Se3-In2O3 Heterojunction for Multibit Non-Volatile Memory and Logic Operations Using Optoelectronic Inputs. npj 2D Mater. Appl. 2022, 6 (37), 1-9.

[46] Si, M.; Saha, A. K.; Gao, S.; Qiu, G.; Qin, J.; Duan, Y.; Jian, J.; Niu, C.; Wang, H.; Wu, W.; Gupta, S. K.; Ye, P. D. A Ferroelectric Semiconductor Field-Effect Transistor. Nat. Electron. 2019, 2 (12), 580-586.

[47] Gong, Y.; Lin, J.; Wang, X.; Shi, G.; Lei, S.; Lin, Z.; Zou, X.; Ye, G.; Vajtai, R.; Yakobson, B. I.; Terrones, H.; Terrones, M.; Tay, B. K.; Lou, J.; Pantelides, S. T.; Liu, Z.; Zhou, W.; Ajayan, P. M. Vertical and In-Plane Heterostructures from WS2/MoS2 Monolayers. Nat. Mater. 2014, 13 (12), 1135-1142.

[48] Brill, A. R.; Kafri, A.; Mohapatra, P. K.; Ismach, A.; De Ruiter, G.; Koren, E. Modulating the Optoelectronic Properties of MoS2by Highly Oriented Dipole-Generating Monolayers. ACS Appl. Mater. Interfaces 2021, 13 (27), 32590-32597.

[49] Wen, B.; Zhu, Y.; Yudistira, D.; Boes, A.; Zhang, L.; Yidirim, T.; Liu, B.; Yan, H.; Sun, X.; Zhou, Y.; Xue, Y.; Zhang, Y.; Fu, L.; Mitchell, A.; Zhang, H.; Lu, Y. Ferroelectric-Driven Exciton and Trion Modulation in Monolayer Molybdenum and Tungsten Diselenides. ACS Nano 2019, 13 (5), 5335-5343.

[50] Sarkar, A. S.; Konidakis, I.; Demeridou, I.; Serpetzoglou, E.; Kioseoglou, G.; Stratakis, E. Robust B-Exciton Emission at Room Temperature in Few-Layers of MoS2: Ag Nanoheterojunctions Embedded into a Glass Matrix. Sci. Rep. 2020, 10 (1), 1-10.

[51] Lee, Y.; Tran, T. T.; Kim, Y.; Roy, S.; Taniguchi, T.; Watanabe, K.; Jang, J. I.; Kim, J. Enhanced Radiative Exciton Recombination in Monolayer WS2on the HBN Substrate Competing with Nonradiative Exciton-Exciton Annihilation. ACS Photonics 2022, 9 (3), 873-879.

[52] Lin, Y.; Ling, X.; Yu, L.; Huang, S.; Hsu, A. L.; Lee, Y. H.; Kong, J.; Dresselhaus, M. S.; Palacios, T. Dielectric Screening of Excitons and Trions in Single-Layer MoS2. Nano Lett. 2014, 14 (10), 5569-5576.

[53] Mohapatra, P. K.; Ranganathan, K.; Ismach, A. Selective Area Growth and Transfer of High Optical Quality MoS2 Layers. Adv. Mater. Interfaces 2020, 7 (24).

[54] Mohapatra, P. K.; Deb, S.; Singh, B. P.; Vasa, P.; Dhar, S. Strictly Monolayer Large Continuous MoS2 Films on Diverse Substrates and Their Luminescence Properties. Appl. Phys. Lett. 2016, 108 (4).

What is claimed is:

1. A heterostructure system, comprising:

a dielectric substrate;

a two-dimensional ferroelectric material on said dielectric substrate;

a two-dimensional semiconductor material having a first region disposed on said ferroelectric material and a second region disposed on said dielectric substrate, wherein an edge of said ferroelectric material is between said first region and said second region;

a polarization screening layer which is between said ferroelectric material and said semiconductor material but not between said semiconductor material and said dielectric substrate; and a polarization actuation mechanism configured to actuate non-volatile polarization at said edge.

2. The system of claim 1, wherein said polarization actuation mechanism is configured to electrically actuate said non-volatile polarization.

3. The system of claim 2, wherein said polarization actuation mechanism comprises at least one mechanism selected from the group consisting of a top gate electrode, a back gate electrode, and a pair of source and drain electrodes connected to said semiconducting material.

4. The system of claim 1, wherein said polarization actuation mechanism is configured to optically actuate said non-volatile polarization.

5. The system of claim 1, wherein said semiconductor material comprises a transition metal dichalcogenide.

6. The system according to claim 5, wherein said transition metal dichalcogenide is selected from the group consisting of $MoS_2$, $WSe_2$, $WS_2$, $MoSe_2$, $TiS_2$, $TiSe_2$, $TiTe_2$, $VS_2$, $VSe_2$, $VTe_2$, $CrS_2$, $CoTe_2$, $NiTe_2$, $ZrS_2$, $ZrSe_2$, $YSe_2$, $NbS_2$, $NbSe_2$, $NbTe_2$, $TcS_2$, $TcSe_2$, $TcTe_2$, $PdS_2$, $PdSe_2$, $PdTe_2$, $LaSe_2$, $HfS_2$, $HfSe_2$, $HfTe_2$, $TaS_2$, $TaSe_2$, $TaTe_2$, $WS_2$, $WSe_2$, $WTe_2$, $ReS_2$, $ReSe_2$, $IrTe_2$, $PtS_2$, $PtSe_2$, $PtTe_2$ and $AuTe_2$.

7. The system of claim 1, wherein said ferroelectric material is selected from the group consisting of $In_2Se_3$, $CuInP_2S_6$, $CuInP_2Se_6$, $CuCrP_2S_6$, and $CuCrP_2Se_6$.

8. The system of claim 1, wherein said ferroelectric material and said semiconductor material are attached to each other by van der Waals forces.

9. The system of claim 1, wherein said polarization actuation mechanism is configured to invert an in-plane or/and an out-of-plane polarization of said ferroelectric material and to modulate the charge concentration at the semiconductor material at said edge.

10. The system according to claim 9, wherein said two-dimensional ferroelectric material and said two-dimensional semiconductor material are selected such that when said polarization is at one state, said first region has doped properties and when said polarization is at an opposite state, said first region has intrinsic properties.

11. The system according to claim 9, wherein said two-dimensional ferroelectric material and said two-dimensional semiconductor material are selected such that when said polarization is at one state, said first region has doped properties of a first polarity and when said polarization is at an opposite state, said first region has doped properties of a second polarity opposite to said first polarity.

12. The system of claim 1, being a component in a device selected from the group consisting of a field effect transistor, a transducer, a sensor, a non-volatile memory, a neuromorphic device, and an energy harvesting device.

13. The system according to claim 12, wherein said transducer is an optical transducer.

14. The system according to claim 12, wherein said sensor is a photo-sensor.

15. An in-memory computing device, comprising the system of claim 1.

16. A method of fabricating a heterostructure system, comprising:

applying a two-dimensional ferroelectric material onto a dielectric substrate; and applying a two-dimensional semiconductor material over said dielectric substrate and said ferroelectric material in a manner that a first region of said semiconductor material is disposed on said ferroelectric material and a second region of said semiconductor material is disposed on said dielectric substrate, wherein an edge of said ferroelectric material is between said first region and said second region of said semiconductor material;

wherein the method comprises applying a polarization screening layer on said ferroelectric material prior to said application of said semiconductor material, and wherein said semiconductor material is applied to said polarization screening layer.

17. The method of claim 16, comprising forming a polarization actuation mechanism contacting at least one of said semiconductor material and said dielectric substrate to allow electrically actuation of non-volatile polarization at said edge.

* * * * *